US011145346B2

(12) United States Patent
Fujino

(10) Patent No.: US 11,145,346 B2
(45) Date of Patent: Oct. 12, 2021

(54) MEMORY DEVICE

(71) Applicant: KIOXIA CORPORATION, Tokyo (JP)

(72) Inventor: Yorinobu Fujino, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/816,020

(22) Filed: Mar. 11, 2020

(65) Prior Publication Data
US 2021/0090628 A1    Mar. 25, 2021

(30) Foreign Application Priority Data
Sep. 20, 2019 (JP) .............................. JP2019-171651

(51) Int. Cl.
*G11C 11/16* (2006.01)
*H01L 43/02* (2006.01)
*H01L 27/22* (2006.01)

(52) U.S. Cl.
CPC ........ *G11C 11/1659* (2013.01); *G11C 11/161* (2013.01); *G11C 11/165* (2013.01); *G11C 11/1655* (2013.01); *G11C 11/1657* (2013.01); *G11C 11/1675* (2013.01); *H01L 27/224* (2013.01); *H01L 43/02* (2013.01)

(58) Field of Classification Search
CPC .............. G11C 11/161; G11C 11/1655; G11C 11/1657; G11C 11/1659; G11C 11/1675; G11C 11/165; H01L 17/224; H01L 43/02
USPC .................................................. 365/158, 171
See application file for complete search history.

(56) References Cited

U.S. PATENT DOCUMENTS

| 6,738,285 | B2 * | 5/2004 | Tanizaki ................. G11C 11/16 |
| | | | 365/158 |
| 7,990,753 | B2 | 8/2011 | Matsuo |
| 8,139,396 | B2 | 3/2012 | Kurosawa et al. |
| 8,681,532 | B2 | 3/2014 | Murooka |
| 10,157,655 | B2 | 12/2018 | Fujino et al. |
| 10,338,835 | B2 | 7/2019 | Osada et al. |

(Continued)

FOREIGN PATENT DOCUMENTS

| JP | 5161697 B2 | 8/2008 |
| JP | 4922375 B2 | 9/2009 |

OTHER PUBLICATIONS

U.S. Appl. No. 16/817,039; First Named Inventor: Yorinobu Fujino; Title: Memory Device; Filed: Mar. 12, 2020.

*Primary Examiner* — Son L Mai
(74) *Attorney, Agent, or Firm* — Holtz, Holtz & Volek PC

(57) ABSTRACT

According to one embodiment, a device includes a first cell between first and second interconnects; a second cell between second and third interconnects; a third cell between fourth and fifth interconnects; a fourth cell between fifth and sixth interconnects; a equalization circuit connected to the first to sixth interconnects; and a control circuit controlling operation on the first to fourth cells. During the operation, the control circuit applies a first voltage to the first interconnect, applies a second voltage higher than the first voltage to the second interconnect, applies a third voltage to the fifth interconnect, and applies a fourth voltage higher than the third voltage to the sixth interconnect. After the operation, the equalization circuit connects the first interconnect to the sixth interconnect.

20 Claims, 17 Drawing Sheets

(56) References Cited

U.S. PATENT DOCUMENTS 10,388,345 B2    8/2019   Hatsuda et al.
10,431,277 B2   10/2019   Hatsuda et al.

\* cited by examiner

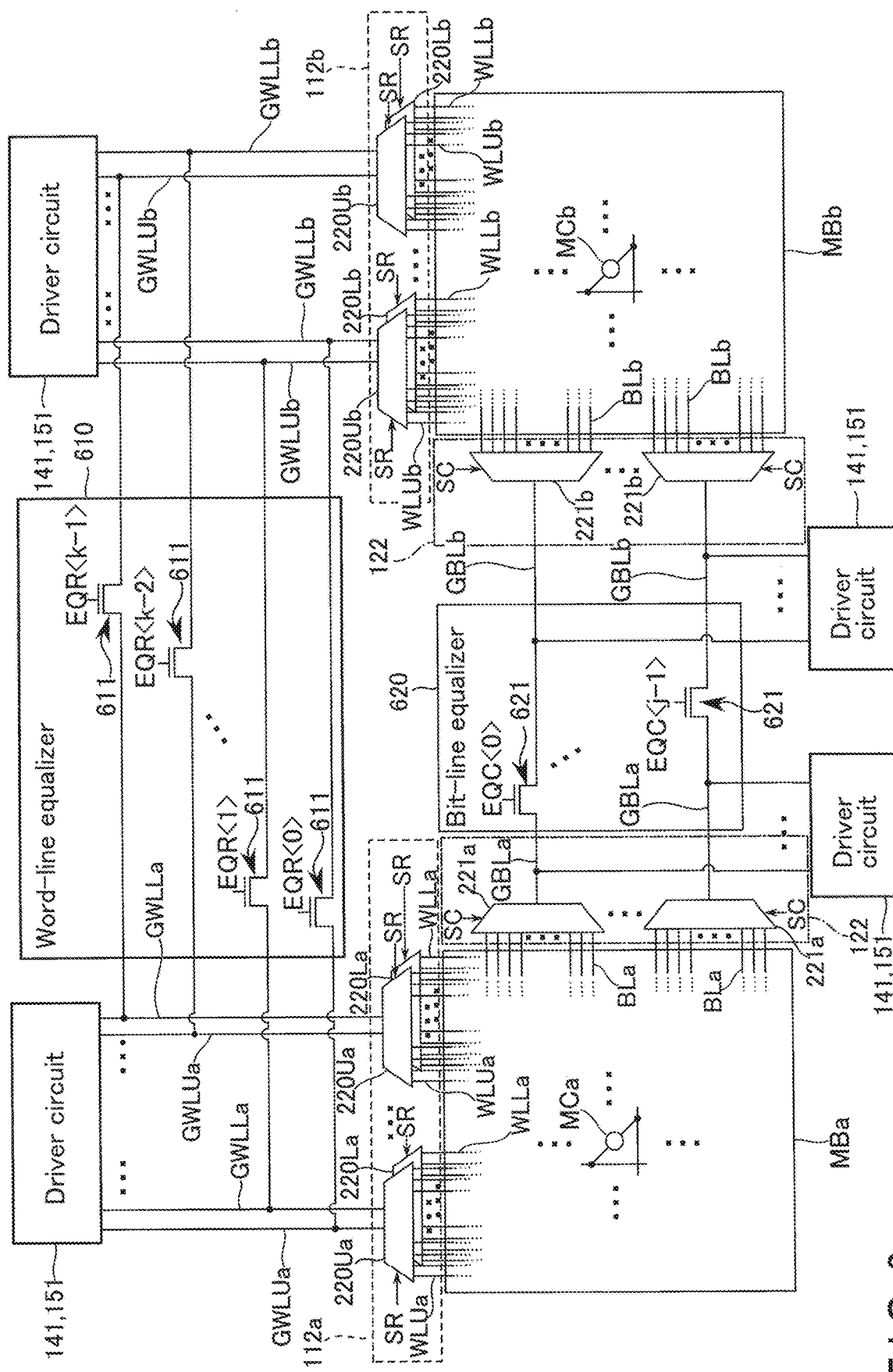
F I G. 6

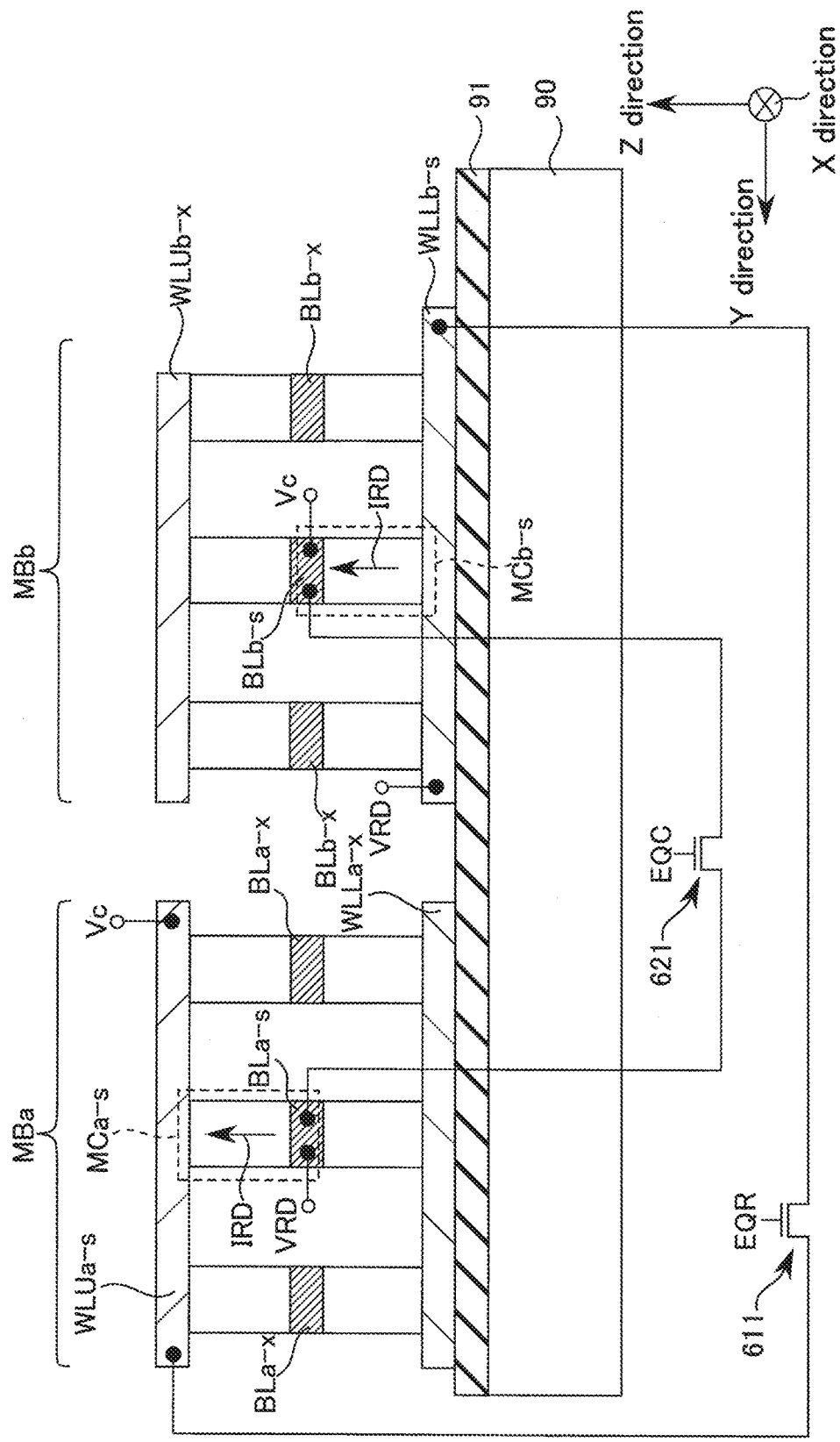
F I G. 12

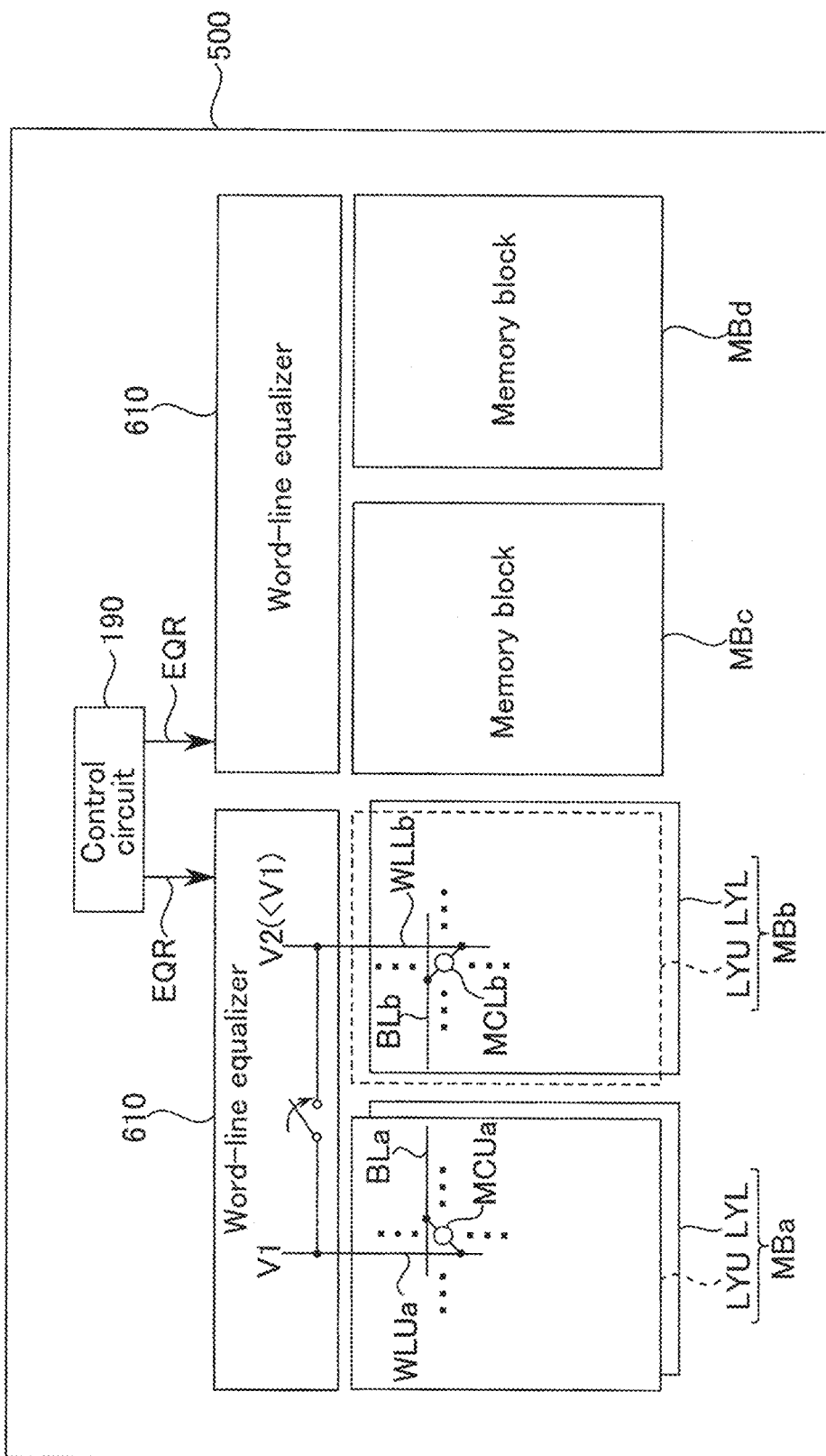
F I G. 13

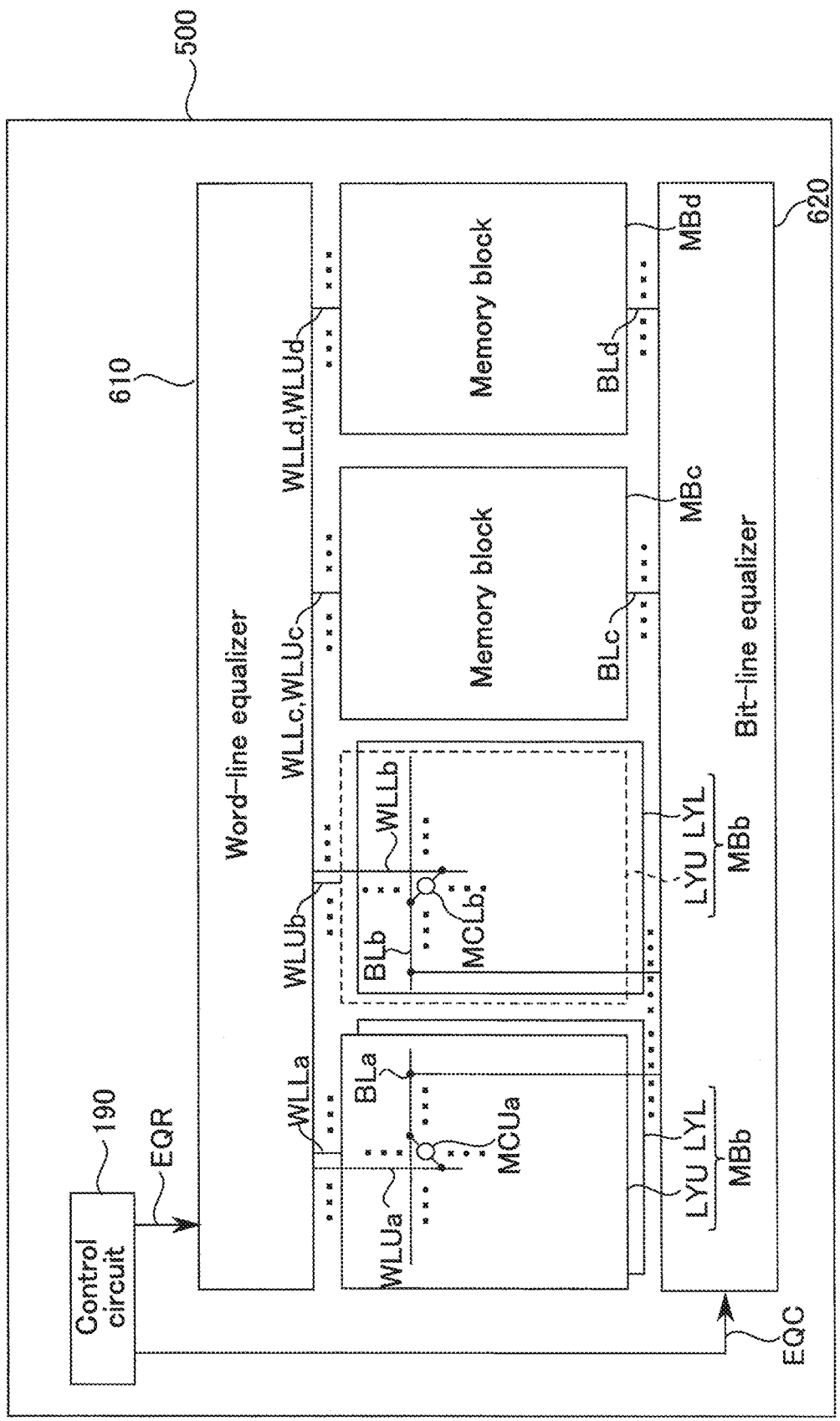
F I G. 15

MEMORY DEVICE

CROSS-REFERENCE TO RELATED APPLICATIONS

This application is based upon and claims the benefit of priority from Japanese Patent Application No. 2019-171651, filed Sep. 20, 2019, the entire contents of which are incorporated herein by reference.

FIELD

Embodiments described herein relate generally to a memory device.

BACKGROUND

Recently, research and development of novel memory devices have been promoted.

BRIEF DESCRIPTION OF THE DRAWINGS

FIG. 6 is a diagram illustrating a configuration example of the memory device of the first embodiment;

FIG. 12 is a diagram for description of the operation example of the memory device of the first embodiment;

FIG. 13 is a diagram illustrating a configuration example of a memory device of a second embodiment;

FIG. 15 is a diagram for description of a memory device of a third embodiment;

DETAILED DESCRIPTION

A memory device and a memory device control method of embodiments will be described below with reference to FIGS. 1 to 17.

The present embodiment will be described below in detail with reference to the accompanying drawings. In the following description, components having identical functions and configurations are denoted by an identical reference sign.

In embodiments described below, when components (for example, various interconnects, various kinds of voltage, and signals) denoted by reference signs each including a number and/or an alphabet at the end to distinguish the components do not need to be distinguished from each other, a notation (reference sign) in which the number and/or the alphabet at the end is omitted is used.

In general, according to one embodiment, a memory device includes: a first memory cell provided between a first interconnect and a second interconnect; a second memory cell provided between the second interconnect and a third interconnect; a third memory cell provided between a fourth interconnect and a fifth interconnect; a fourth memory cell provided between the fifth interconnect and a sixth interconnect; a first equalization circuit connected to the first, third, fourth, and sixth interconnects; and a control circuit configured to control operation on the first to fourth memory cells. During execution of the operation, the control circuit selects the first and fourth memory cells, applies first voltage to the first interconnect, applies second voltage higher than the first voltage to the second interconnect, applies third voltage lower than the second voltage to the fifth interconnect, and applies fourth voltage higher than the third voltage to the sixth interconnect, and after the operation, the first equalization circuit electrically connects the first interconnect to the sixth interconnect.

(1) First Embodiment

A memory device of a first embodiment will be described below with reference to FIGS. 1 to 12.

(a) BASIC CONFIGURATION

A basic configuration of the memory device of the present embodiment will be described below with reference to FIGS. 1 to 3.

Figure 1:
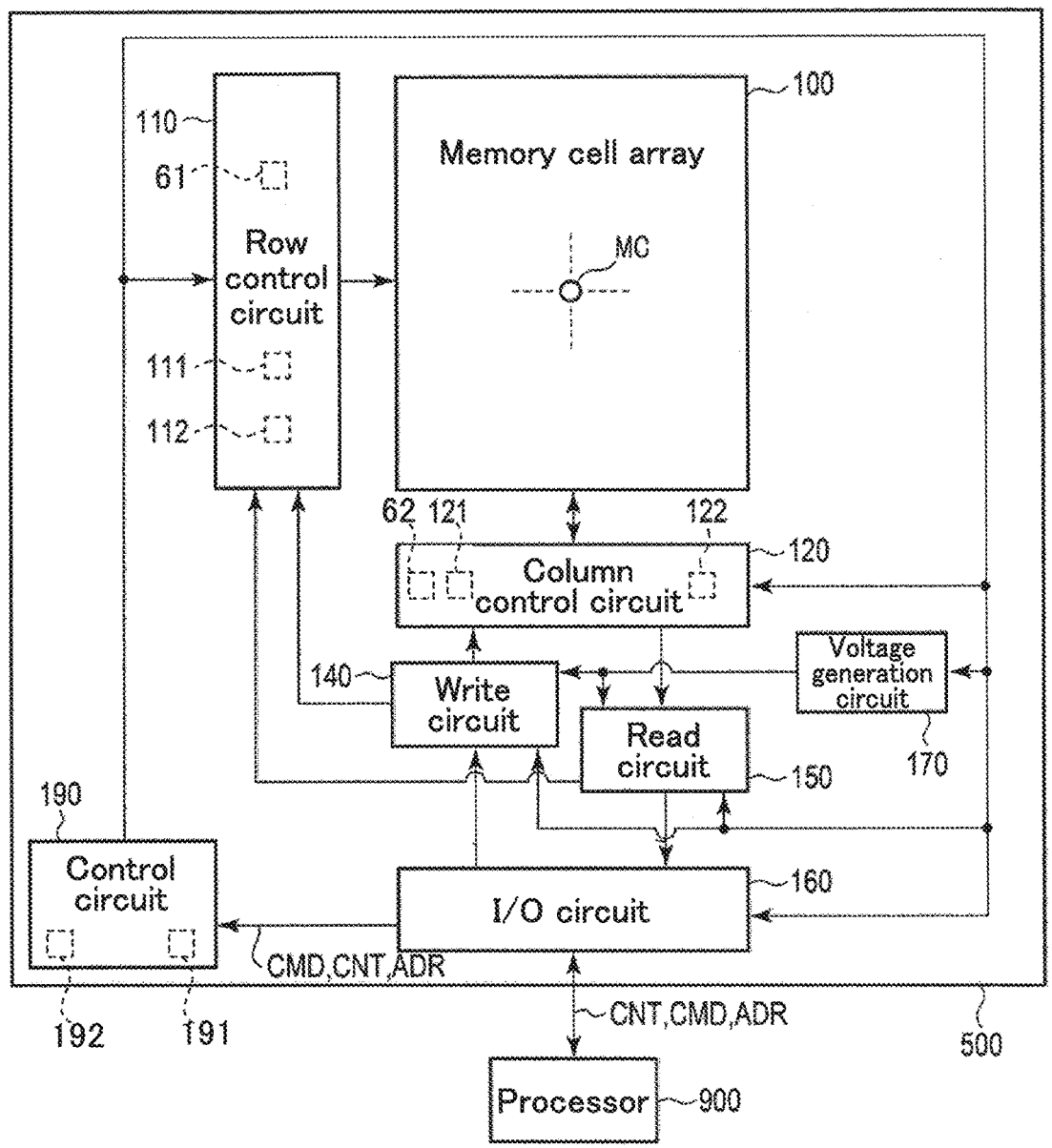
FIG. 1 is a diagram illustrating a configuration example of a memory device of a first embodiment.

FIG. 1 is a block diagram illustrating a configuration example of the memory device of the present embodiment.

As illustrated in FIG. 1, a memory device 500 of the present embodiment includes a memory cell array 100, a row control circuit 110, a column control circuit 120, a write circuit 140, a read circuit 150, an I/O circuit 160, a voltage generator 170, and a control circuit 190.

One or more memory cell arrays 100 include a plurality of memory cells MC. Each memory cell MC includes, for example, a variable resistance element. The variable resistance element is used for data storage as a memory element. Each memory cell array 100 means a set of a plurality of memory regions in some cases.

For example, the memory cell array 100 includes a plurality of control units MB.

The row control circuit 110 controls a plurality of rows of the memory cell array 100. The row control circuit 110 is supplied with a decoding result (row address) of an address ADR. The row control circuit 110 sets a row (for example, a word line) based on the decoding result of the address ADR to a selection state. Hereinafter, the row (or word line) set to the selection state is referred to as a selection row (or selection word line). Any row other than the selection row is referred to as a non-selection row (or non-selection word line).

The row control circuit 110 includes, for example, a global word-line selection circuit 111 and a word-line selection circuit 112.

The column control circuit 120 controls a plurality of columns of the memory cell array 100. The column control circuit 120 is supplied with the decoding result of the address ADR (column address). The column control circuit 120 sets a column (for example, at least one bit line) based on the decoding result of the address ADR to the selection state. Hereinafter, the column (or bit line) set to the selection state is referred to as a selected column (or selected bit line). Any column other than the selection column is referred to as a non-selected column (or non-selected bit line).

The column control circuit 120 includes, for example, a global bit-line selection circuit 121 and a bit-line selection circuit 122.

The write circuit 140 performs various kinds of control for write operation (data write). In the write operation, the write circuit 140 supplies a write pulse formed of current and/or voltage to the memory cells MC through the row control circuit 110 and the column control circuit 120. Accordingly, data DT is written to the memory cells MC.

For example, the write circuit 140 includes a driver circuit 141, a voltage source, a current source and a latch circuit.

The read circuit 150 performs various kinds of control for read operation (data read). In the read operation, the read circuit 150 supplies a read pulse (for example, read current) to the memory cells MC through the row control circuit 110 and the column control circuit 120. The read circuit 150 senses the current value of current output from the memory cells or the potential of a interconnect through which the current from the memory cells flows. Accordingly, the data DT in the memory cells MC is read.

For example, the read circuit 150 includes a driver circuit 151, a voltage source and/or a current source, a latch circuit, and a sense amplifier circuit.

The write circuit 140 and the read circuit 150 are not limited to circuits independent from each other. For example, the write circuit and the read circuit may include a common component that can be used by both circuits, and may be provided as one integrated circuit in the memory device 500.

The I/O circuit (input/output circuit) 160 is an interface circuit for transmission and reception of various signals in the memory device 500.

In the write operation, the I/O circuit 160 forwards, to the write circuit 140 as write data, the data DT from a processor 900 of an external device (controller or host device). In the read operation, the I/O circuit 160 forwards, to the processor 900 as read data, the data DT output from the memory cell array 100 to the read circuit 150.

The I/O circuit 160 forwards, to the control circuit 190, the address ADR and a command CMD from the processor 900. The I/O circuit 160 performs transmission and reception of various control signals CNT between the control circuit 190 and the external device.

The voltage generator 170 generates voltage for various kinds of operation of the memory cell array 100 by using power supply voltage provided from the external device. For example, in the write operation, the voltage generator 170 outputs various kinds of voltage generated for the write operation to the write circuit 140. In the read operation, the voltage generator 170 outputs various kinds of voltage generated for the read operation to the read circuit 150.

The control circuit (also referred to as a state machine, a sequencer, or an internal controller) 190 controls operation of the circuits in the memory device 500 based on the control signal CNT, the address ADR, and the command CMD.

For example, the command CMD is a signal indicating operation to be executed by the memory device 500. For example, the address ADR is a signal indicating the coordinates of one or more memory cells (hereinafter referred to as selection cells) as operation targets in the memory cell array 100. For example, the control signal CNT is a signal for controlling operation timings of the external device and the memory device 500 and an operation timing inside the memory device 500.

The control circuit 190 includes, for example, a command decoder, an address decoder, and a latch circuit. For example, the control circuit 190 may have a conversion table for decoding the address ADR.

Figure 2:
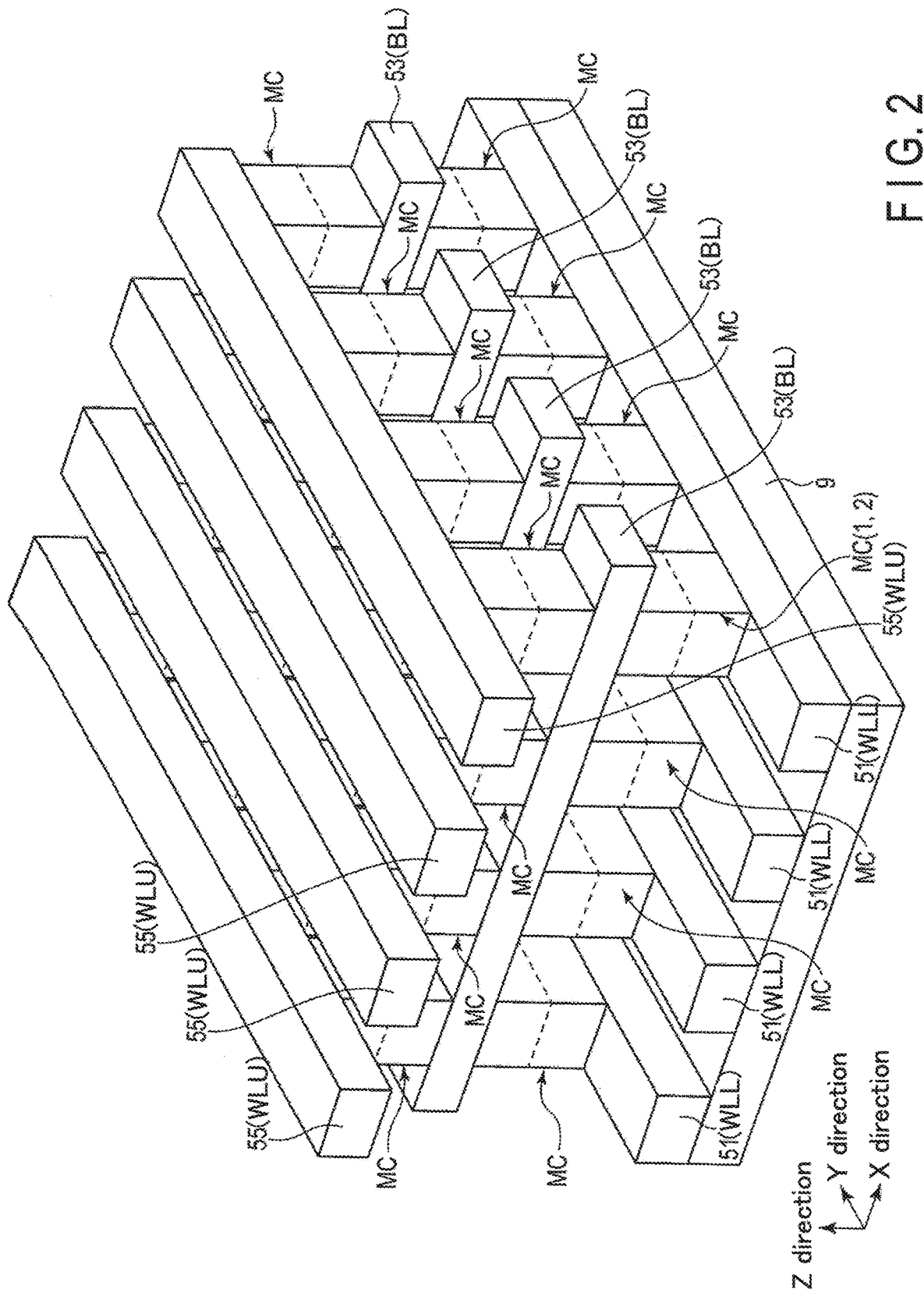
FIG. 2 is a diagram illustrating a configuration example of a memory cell array of the memory device of the first embodiment.

FIG. 2 is a bird's-eye view of illustrating a structure example of the memory cell array in the memory device of the present embodiment.

As illustrated in FIG. 2, in the memory cell array 100, each memory cell MC is provided between a plurality of interconnects 51, 53, and 55.

The interconnects 51, 53, and 55 are provided above a surface of a substrate 9.

Each interconnect 51 extends in a Y direction. The interconnects 51 are arranged in an X direction. Each interconnect 53 extends in the X direction. The interconnects 53 are arranged in the Y direction. Each interconnect 55 extends in the Y direction. The interconnects 55 are arranged in the X direction.

The interconnects 53 are provided above the interconnects 51 in a Z direction. The interconnects 55 are provided above the interconnects 53 in the Z direction. The interconnects 53 are provided between the set of interconnects 51 and the set of interconnects 55 in the Z direction.

In an example illustrated in FIG. 2, the interconnects 51 and the interconnects 55 are word lines WL (WLL and WLU), and the interconnects 53 are bit lines BL.

The X direction is a direction parallel to the surface of the substrate 9. The Y direction is a direction parallel to the surface of the substrate 9 and intersecting (for example, orthogonal to) the X direction. The Z direction is a direction perpendicular to the surface (X-Y plane) of the substrate 9.

The memory cells MC are three-dimensionally arrayed in the memory cell array 100. The memory cells MC are arrayed in a matrix of rows and columns in the X-Y plane. The memory cells MC are arrayed in the Z direction.

A memory cell MCL is provided between each interconnect 51 (word line WLL) and each interconnect 53 (bit line BL). A memory cell MCU is provided between each interconnect 53 (bit line BL) and each interconnect 55 (word line WLU). Each interconnect 53 is provided between each two corresponding memory cells MC arranged in the Z direction.

Each two memory cells MC arranged in the Z direction share the interconnect 53 between the two memory cells MC arranged in the Z direction.

Each two memory cells MC arranged in the Z direction are connected to a common bit line BL. The two memory cells MC arranged in the Z direction are connected to the word lines WLL and WLU different from each other. One of the two memory cells MC arranged in the Z direction is connected to the word line WLL below the bit line BL in the Z direction, and the other memory cell is connected to the word line WLU above the bit line BL in the Z direction.

Hereinafter, a layer including the memory cells MC two-dimensionally arrayed in the X-Y plane is referred to as an array layer, a MAT, or a memory tile. The memory cell array 100 in FIG. 2 has a structure in which two array layers LYL and LYU are arrayed in the Z direction.

Hereinafter, the array layer on the lower side (substrate side) in the Z direction among the two array layers is referred to as the lower array layer LYL. The array layer on the upper side in the Z direction among the two array layers is referred to as the upper array layer LYU. The lower array layer LYL is disposed between the upper array layer LYU and the substrate 9. In the present embodiment, the positions of the array layers LYU and LYL in the Z direction are referred to as levels.

Hereinafter, among each two word lines WLL and WLU arranged in the Z direction, the word line WLL in the lower array layer LYL is referred to as a lower word line WLLU, and the word line WLL in the upper array layer LYU is referred to as an upper word line WLU.

For example, in the memory cell array 100 in FIG. 2, each MC memory cell is a structural body in which a memory element 1 and a switching element 2 are arranged in the Z direction.

The structure of the memory cell array 100 is not limited to that in the example illustrated in FIG. 2.

When the substrate 9 is a semiconductor substrate (for example, a silicon substrate), circuits (hereinafter referred to as CMOS circuits) such as the row control circuit 110 and the column control circuit 120 other than the memory cell array 100 may be provided on the semiconductor substrate. Accordingly, the memory cell array 100 is provided above the CMOS circuits in the Z direction. The memory cell array 100 is disposed on an insulating layer covering the CMOS circuits.

Figure 3:
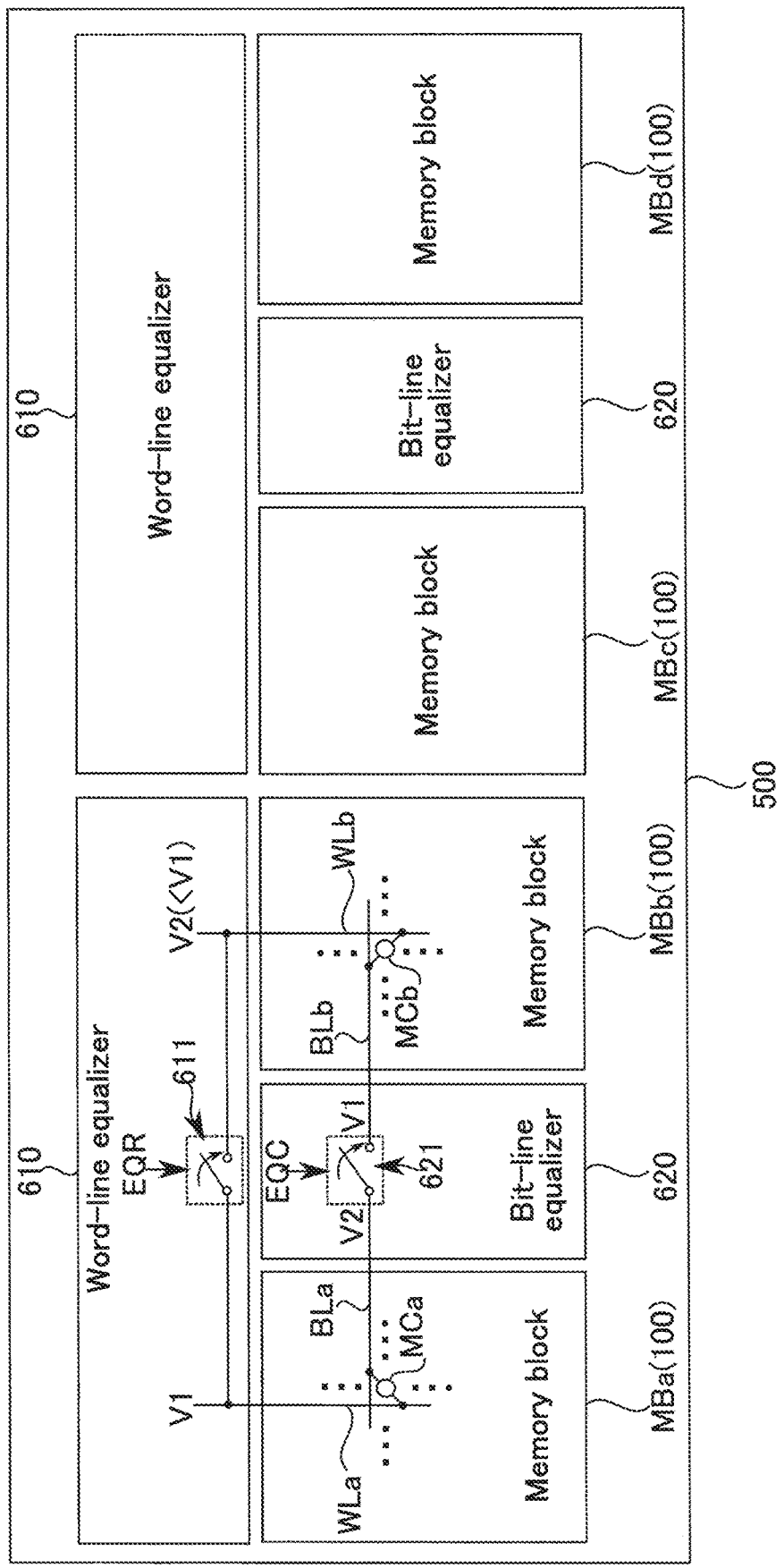
FIG. 3 is a diagram illustrating a configuration example of the memory device of the first embodiment.

FIG. 3 is a pattern diagram for description of the basic configuration of the memory device of the present embodiment.

As illustrated in FIG. 3, in the present embodiment, the memory cell array 100 includes a plurality of memory blocks MB (MBa, MBb, MBc, and MBd). Operation of the memory cells can be controlled in units of memory blocks.

In the present embodiment, the memory device 500 includes equalization circuits 610 and 620. The equalization circuits 610 and 620 are provided in the row control circuit 110 and the column control circuit 120.

The equalization circuit (hereinafter referred to as a word line equalizer) 610 in the row control circuit 110 is connected to the word lines WLL and WLU of the memory blocks MBa and MBb.

The equalization circuit (hereinafter referred to as a bit line equalizer) 620 in the column control circuit 120 is connected to the bit lines BL of the memory blocks MBa and MBb.

The word line equalizer 610 includes a plurality of switching elements 611. The one or more switching elements 611 are provided between and connected to a word line WLa of the memory block MBa and a word line WLb of the memory block MBb.

The switching elements 611 are set to an off state by a control signal EQR during execution of operation of the memory blocks MB. The switching elements 611 are set to an on state by the control signal EQR on completion of the operation of the memory blocks MB.

The bit line equalizer 620 includes a plurality of switching elements 621. The one or more switching elements 621 are provided between and connected to a bit line BLa of the memory block MBa and a bit line BLb of the memory block MBb.

The switching elements 621 are set to an off state by a control signal EQC during execution of the operation of the memory blocks MB. The switching elements 621 are set to an on state by the control signal EQC on completion of the operation of the memory blocks MB.

During execution of operation of the memory device, voltage having a certain voltage value is supplied to a plurality of the memory blocks MB in accordance with the state of the memory blocks MB.

During execution of certain operation, voltage V1 is applied to the bit line BLa of the memory block MBa, and voltage V2 is applied to the word line WLa of the memory block MBa. The voltage V1 is applied to the word line WLb of the memory block MBb, and the voltage V2 is applied to the bit line BLb of the memory block MBb.

For example, the voltage V1 is higher than the voltage V2.

After completion of the operation of the memory blocks MBa and MBb, the word line equalizer 610 electrically connects a high-potential word line (in this example, the word line WLb) of one of the memory blocks with a low-potential word line (in this example, the word line WLa) of the other memory block through the switching elements 611 in the on state. Charge shear occurs between the two word lines WLa and WLb through the switching elements 611 in the on state.

Accordingly, the potentials of the word lines WLa and WLb electrically connected to each other are set to be voltage (for example, voltage higher than 0 V) between the voltage V1 and the voltage V2.

After completion of the operation of the memory blocks MBa and MBb, the bit line equalizer 620 electrically connects a high-potential bit line (in this example, the bit line BLa) of one of the memory blocks with a low-potential bit line (in this example, BLb) of the other memory block through the switching elements 621 in the on state. Charge shear occurs between the two bit lines BLa and BLb through the switching elements 621 in the on state.

Accordingly, the potentials of the bit lines BLa and BLb electrically connected to each other are set to be voltage between the voltage V1 and the voltage V2 approximately.

In this manner, in the present embodiment, after completion of certain operation, the word lines and the bit lines in the memory cell array are precharged through charge shear for the next operation. Accordingly, in the memory device 500 of the present embodiment, the amount of charging of the word and bit lines can be reduced during execution of the next operation.

As a result, the memory device of the present embodiment can reduce increase of electric power consumption.

(b) EXAMPLE

An example of the present embodiment of the memory device will be described below with reference to FIGS. 4 to 12.

(b-1) Configuration Example

Memory Cell Array

A configuration example of the memory cell array of the memory device of the present embodiment will be described below with reference to FIGS. 4 and 5.

Figure 4:
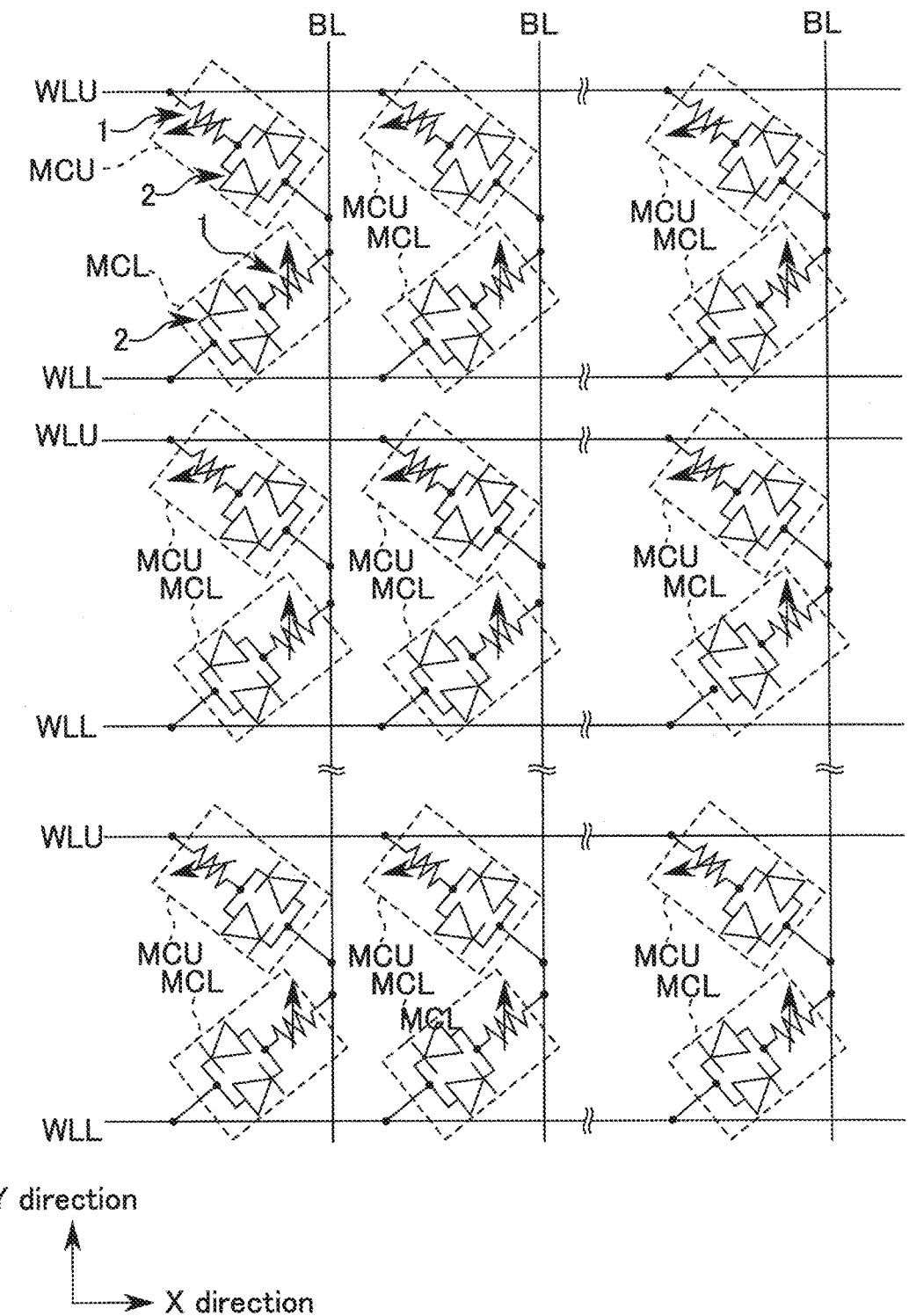
FIGS. 4 and 5 are diagrams illustrating a structure example of the memory cell array of the memory device of the first embodiment.

FIG. 4 is an equivalent circuit diagram illustrating an internal configuration example of the memory cell array of the memory device of the present embodiment.

FIG. 4 is an equivalent circuit diagram illustrating a configuration example of the memory cell array of the memory device.

As illustrated in FIG. 2, in the memory cell array 100, the bit lines BL are arrayed in the Y direction. Each bit line BL extends in the X direction. In the memory cell array 100, the word lines WL (WLL<0>, WLL<1>, ..., WLU<0>, WLU<1>, ...) are arrayed in the X direction. Each bit line BL extends in the Y direction. Numbers N and M are positive natural numbers.

The memory cells MC (MCL and MCU) are each disposed between the corresponding bit line BL and the corresponding word line WL. The memory cell MC is electrically connected to the bit line BL and the word line.

The memory cells MC arrayed in the Y direction are commonly connected to one word line WL. The memory cells MC arrayed in the X direction are commonly connected to one bit line BL.

When the memory device of the present embodiment is a resistance random access memory, each memory cell MC includes one variable resistance element 1 and one switching element 2.

The variable resistance element 1 and the switching element 2 are provided between and connected in series with the bit line BL and the word line WL. One end of the variable resistance element 1 is connected to one of the bit line BL and the word line WL, and the other end of the variable resistance element 1 is connected to the other of the bit line BL and the word line WL through the switching element 2.

In an example illustrated in FIG. 4, each memory cell MCU is provided between and connected to the corresponding word line WLU and the corresponding bit line BL. One end of the variable resistance element 1 of the memory cell MCU is connected to the bit line BL through the switching element 2. The other end of the variable resistance element 1 of the memory cell MCU is connected to the word line WLU. Each memory cell MCL is provided between and connected to the corresponding word line WLL and the corresponding bit line BL. One end of the variable resistance element 1 of the memory cell MCL is connected to the bit line BL. The other end of the variable resistance element 1 of the memory cell MCL is connected to the word line WLL through the switching element 2.

Each variable resistance element 1 functions as the memory element of the corresponding memory cell MC. The variable resistance element 1 can have any of a plurality of resistance values in accordance with change of the resistance state of the element 1. Through association of the resistance values of the variable resistance element 1 with data, the variable resistance element 1 is used as a memory element that stores data of one bit or more.

Each switching element 2 switches turning-on/off (selection/non-selection) of the corresponding memory cell MC.

The switching element 2 is set to an on state (low-resistance state or conductive state) while voltage equal to or higher than threshold voltage of the switching element 2 is applied to the memory cell MC. The switching element 2 is set to an off state (high-resistance state or non-conductive state) while voltage lower than the threshold voltage of the switching element 2 is applied to the memory cell.

The switching element 2 in the conductive state allows current to flow into the memory cell MC. The switching element 2 in the on state supplies, to the variable resistance element 1 in accordance with the potential difference between the bit line and the word line, current flowing from the bit line side toward the word line side or current flowing from the word line side toward the bit line side. In this manner, the switching element 2 allows bidirectional current flow to the memory element 1. For example, the switching element 2 functions as a bidirectional diode.

Figure 5:
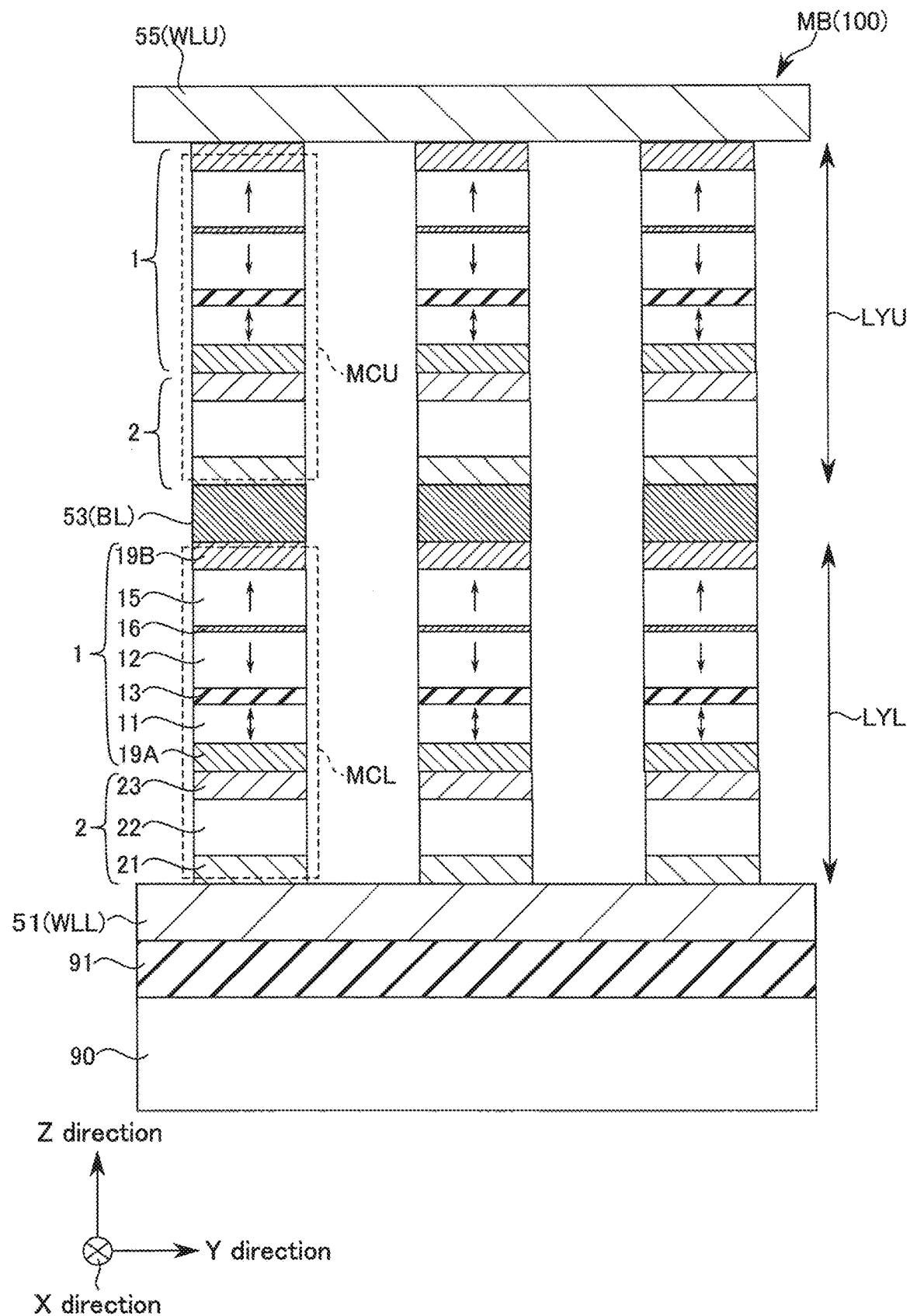

FIG. 5 is a cross-sectional view illustrating a structure example of the memory device of the present embodiment.

FIG. 5 illustrates an extracted part of a sectional structure of the memory cell array in the Y direction.

As described above, in the present embodiment, the memory cell array includes the array layers LYU and LYL arrayed in the Z direction.

As illustrated in FIG. 5, the two array layers LYU and LYL are provided in the memory cell array 100.

The array layer LYU is provided above a substrate 90 in the Z direction.

The array layer LYL is provided between the array layer LYU and the substrate 90.

The memory cells MC (MCU and MCL) are two-dimensionally arrayed in each of the array layers LYU and LYL.

For example, when the memory device is a memory (for example, a magnetoresistive random access memory) including a magnetoresistive effect element as a memory element, each memory cell MC is a stack including a magnetoresistive effect element 1 and a switching element 2.

For example, the magnetoresistive effect element 1 includes two magnetic layers 11 and 12 and a non-magnetic layer 13. The non-magnetic layer 13 is provided between the two magnetic layers 11 and 12 in the Z direction. The two magnetic layers 11 and 12 and the non-magnetic layer 13 arrayed in the Z direction form a magnetic tunnel junction (MTJ).

Hereinafter, the magnetoresistive effect element 1 including the magnetic tunnel junction is referred to as an MTJ element. Hereinafter, the non-magnetic layer 13 in the MTJ element 1 is referred to as a tunnel barrier layer.

The magnetic layers 11 and 12 are ferromagnetic layers containing, for example, cobalt, iron, boron, and/or the like. The magnetic layers 11 and 12 may be each a single-layer film or a multi-layered film (for example, an artificial lattice film). The tunnel barrier layer 13 is an insulating film containing, for example, magnesium oxide. The tunnel barrier layer may be a single-layer film or a multi-layered film.

For example, the magnetic layers 11 and 12 each have perpendicular magnetic anisotropy. The direction of a magnetization easy axis of each magnetic layer is perpendicular to a layer surface (film surface) of the magnetic layer. The magnetic layers 11 and 12 each have magnetization perpendicular to the layer surfaces of the magnetic layers 11 and 12. The direction of magnetization of each of the magnetic layers 11 and 12 is parallel to the array direction (Z direction) of the magnetic layers 11 and 12.

The orientation of magnetization of the magnetic layer 11 is variable. The orientation of magnetization of the magnetic layer 12 is invariable (fixed). Hereinafter, the magnetic layer 11, the orientation of magnetization of which is variable, is referred to as a storage layer. Hereinafter, the magnetic layer 12, the orientation of magnetization of which is invariable (fixed), is referred to as a reference layer. The storage layer 11 is also referred to as a free layer, a magnetization free layer, or a magnetization variable layer in some cases. The reference layer 12 is also referred to as a pin layer, a pinned layer, a magnetization invariable layer, or a magnetization fixed layer in some cases.

In the present embodiment, "the orientation of magnetization of the reference layer (magnetic layer) is invariable" or "the orientation of magnetization of the reference layer (magnetic layer) is fixed" means that, when current or voltage for changing the orientation of magnetization of the storage layer is supplied to the magnetoresistive effect element, the orientation of magnetization of the reference layer is not changed by the supplied current or voltage before and after the current or voltage supply.

For example, the MTJ element 1 according to the present embodiment includes two electrodes 19A and 19B. The magnetic layers 11 and 12 and the tunnel barrier layer 13 are provided between the two electrodes 19A and 19B in the Z direction. The reference layer 12 is provided between the electrode 19B and the tunnel barrier layer 13. The storage layer 11 is provided between the electrode 19A and the tunnel barrier layer 13.

For example, a shift cancelling layer 15 is provided in the MTJ element 1. The shift cancelling layer 15 is provided between the reference layer 12 and the electrode 19B. The shift cancelling layer 15 is a magnetic layer for reducing influence of a stray magnetic field of the reference layer 12.

A non-magnetic layer 16 is provided between the shift cancelling layer 15 and the reference layer 12. The non-magnetic layer 16 is, for example, a metal layer such as a Ru layer.

The reference layer 12 is antiferromagnetically connected to the shift cancelling layer 15 through the non-magnetic layer 16. Accordingly, a stack including the reference layer 12, the non-magnetic layer 16, and the shift cancelling layer 15 form a synthetic antiferromagnetic (SAF) structure. In the SAF structure, the orientation of magnetization of the shift cancelling layer 15 is opposite to the orientation of magnetization of the reference layer 12. With the SAF structure, the orientation of magnetization of the reference layer 12 is set to be fixed.

For example, the MTJ element 1 may include an underlayer (not illustrated) and/or a capping layer (not illustrated). The underlayer is provided between the magnetic layer (in this example, the storage layer) 11 and the electrode 19A. The underlayer is a non-magnetic layer (for example, a conductive compound layer). The underlayer is a layer for improving characteristics (for example, crystalline and/or magnetic characteristics) of the magnetic layer 11 contacting the underlayer. The capping layer is a non-magnetic layer (for example, a conductive compound layer) between the magnetic layer (in this example, the shift cancelling layer) 15 and the electrode 19B. The capping layer is a layer for improving characteristics (for example, crystalline and/or magnetic characteristics) of the magnetic layer 15 contacting the capping layer.

At least one of the underlayer and the capping layer may be regarded as a component of an electrode 19 (19A or 19B).

The switching element 2 includes two electrodes 21 and 23 and a switching layer (hereinafter also referred to as a resistance change layer) 22. The switching layer 22 is provided between the two electrodes (conductive layers) 21 and 23. In the switching element 2, the electrode 21, the switching layer 22, and the electrode 23 are arrayed in the Z direction. The switching layer 22 is provided between the two electrodes 21 and 23. The switching layer 22 is made of transition metal oxide or a chalcogenide compound.

When each two memory cells MCU and MCL are arranged in the Z direction, the memory cell MCU is disposed above the memory cell MCL through the corresponding interconnect 53 in the Z direction.

For example, in the memory cell MCL below the interconnect 53, the switching element 2 is provided on the corresponding interconnect 51 on an insulating layer 91 covering the substrate 90.

In the switching element 2 on the interconnect 51, the electrode 21, the switching layer 22, and the electrode 23 are disposed on the interconnects 51 in the stated order in a direction from the interconnect 51 side toward the interconnect 53 side.

The MTJ element 1 is provided on the switching element 2 in the Z direction. The interconnect 53 is provided on the MTJ element 1 in the Z direction. More specifically, in the MTJ element 1, the electrode 19A, the storage layer 11, the tunnel barrier layer 13, the reference layer 12, the non-magnetic layer (metal layer) 16, the shift cancelling layer 15, and the electrode 19B are disposed on the electrode 23 of the switching element 2 in the stated order in the direction from the interconnect 51 side toward the interconnect 53 side.

For example, in the memory cell MCU above the interconnect 53, the switching element 2 is provided on the interconnect 53, and the MTJ element 1 is provided on the switching element 2. The interconnect 55 is provided on the MTJ element 1. More specifically, in the switching element 2 on the interconnect 53, the electrode 21, the switching layer 22, and the electrode 23 are disposed on the interconnect 53 in the stated order in a direction from the interconnect 53 side toward the interconnect 55 side (the direction from the interconnect 51 side toward the interconnect 53 side).

In the MTJ element 1, the electrode 19A, the storage layer 11, the tunnel barrier layer 13, the reference layer 12, the non-magnetic layer 16, the shift cancelling layer 15, and the electrode 19B are disposed on the electrode 23 in the stated order in the direction from the interconnect 53 side toward the interconnect 55 side. The interconnect 55 is disposed on the electrode 19B.

In the present embodiment, in the memory blocks and the levels LYL and LYU, the storage layer and the reference layer in the MTJ element are arrayed in an order identical between a plurality of memory cells (for example, all memory cells) in the Z direction.

In the memory cell array 100, the disposition order of the MTJ element 1 and the switching element 2 in the Z direction and the disposition order of the components (layers) of the elements 1 and 2 are not limited to the above-described examples as long as desired functions and characteristics can be achieved. The disposition order of the MTJ element 1 and the switching element 2 in the Z direction and the disposition order of the components (layers) of the elements 1 and 2 can be changed as appropriate in accordance with an internal configuration of the memory cell array 100.

Data writing to each memory cell is executed by controlling the orientation of magnetization of the storage layer of the MTJ element 1. Through the data writing, the resistance state (resistance value) of the MTJ element 1 corresponding to a magnetization arrangement state changes. For example, when the orientation of magnetization of the storage layer 11 is switched through spin transfer torque (STT), write current is supplied to the MTJ element 1.

Change of the magnetization arrangement state of the MTJ element 1 from an AP state to a P state or change of the magnetization arrangement state of the MTJ element 1 from the P state to the AP state is controlled in accordance with whether the write current flows from the storage layer 11 to the reference layer 12 or flows from the reference layer 12 to the storage layer 11. The current value of the write current is set to be smaller than a magnetization switching threshold value of the reference layer 12 and equal to or larger than a magnetization switching threshold value of the storage layer 11. Spin torque that contributes to magnetization switching (magnetization inversion) of the storage layer 11 is generated by the write current flowing inside the MTJ element. The generated spin torque is applied to the storage layer 11.

When the magnetization arrangement state of the MTJ element 1 is changed from the AP state to the P state (hereinafter also referred to as P write), the spin torque of spin (electron) in an orientation same as the orientation of magnetization of the reference layer 12 is applied to magnetization of the storage layer 11. When the orientation of magnetization of the storage layer 11 is opposite to the orientation of magnetization of the reference layer 12, the orientation of magnetization of the storage layer 11 is changed to an orientation same as the orientation of magnetization of the reference layer 12 by the applied spin torque.

As a result, the magnetization arrangement state of the MTJ element 1 is set to be the P state.

When the magnetization arrangement state of the MTJ element 1 is changed from the P state to the AP state (hereinafter also referred to as AP write), the spin torque of spin in an orientation opposite to the orientation of magnetization of the reference layer 12 is applied to magnetization of the storage layer 11. When the orientation of magnetization of the storage layer 11 is same as the orientation of magnetization of the reference layer 12, the orientation of magnetization of the storage layer 11 is changed to an orientation opposite to the orientation of magnetization of the reference layer 12 by the applied spin torque.

As a result, the magnetization arrangement state of the MTJ element 1 is set to be the AP state.

Data reading from a memory cell is executed by determining the magnetization arrangement state (resistance value) of the MTJ element 1. At the data reading, read current is supplied to the MTJ element 1. The current value of the read current is set to be a value smaller than the magnetization switching threshold value of the storage layer 11. The resistance value (magnetization arrangement state) of the MTJ element 1 is equivalently determined based on the magnitude of an output value (for example, a current value or a voltage value) from the MTJ element 1 to which the read current is supplied.

Accordingly, data in the memory cell is determined and read.

In the present embodiment, description is made on the case in which the memory element 1 is an MTJ element. However, the memory element 1 may be a phase change element (for example, a chalcogenide element) or a resistance element (for example, a transition metal oxide element).

Equalization Circuit

A configuration example of each equalization circuit of the memory device (for example, a magnetoresistive random access memory) of the present embodiment will be described below with reference to FIG. 6.

FIG. 6 is a pattern diagram illustrating an internal configuration example of each equalization circuit of a magnetoresistive random access memory according to the present embodiment.

As illustrated in FIG. 6, the two memory blocks MBa and MBb are connected to one word line equalizer 610 and one bit line equalizer 620.

The word line equalizer 610 is provided at one end of each memory block MB in the Y direction.

The word line equalizer 610 is electrically connected to the two memory blocks MBa and MBb adjacent to each other in the X direction.

For example, the bit line equalizer 620 is disposed between the two memory blocks MBa and MBb connected to the common word line equalizer 610. The bit line equalizer 620 is commonly connected to the two memory blocks MB sandwiching the bit line equalizer 620 in the X direction.

For example, a hierarchical word-line structure is used for rows of each memory block MB.

The memory blocks MBa and MBb having the hierarchical word-line structure each include a plurality of global word lines and a plurality of word lines (hereinafter also referred to as local word lines).

When the memory block MB includes a lower word line WLL and an upper word line WLU, a global word line (hereinafter referred to as a lower global word line) GWLL corresponding to the lower word line WLL, and a global word line (hereinafter referred to as an upper global word line) GWLU corresponding to the upper word line WLU are provided in the memory block (or a region near the memory block).

The global word lines GWLL and GWLU are each connected to the corresponding one of a plurality of selectors 220 (220La, 220Lb, 220Ua, and 220Ub) in the word-line selection circuit 112. The word lines WLL and WLU are connected to the corresponding selector 220. A selection signal SR is supplied to each selector 220. The selection signal SR is a signal obtained from a decoding result of a row address in the address ADR. Accordingly, one of the word lines WLL, WLU, WLL and WLU is selected.

For example, the global word lines GWLL and GWLU are connected to the global word-line selection circuit 111. Accordingly, one of the global word lines GWLL and GWLU, which corresponds to the decoding result of the address ADR is selected.

The global word lines GWLLa, GWLUa, GWLLb, and GWLUb are connected to the driver circuits 141 and 151. The driver circuits 141 and 151 supply various kinds of voltage to the word lines WLL and WLU through the global word lines GWLL and GWLU in accordance with executed operation.

The global word lines GWLLa, GWLUa, GWLLb, and GWLUb are connected to the word line equalizer 610.

The word line equalizer 610 includes one or more switching elements 611.

The switching elements 611 are, for example, field effect transistors (hereinafter referred to as transistors). The switching elements 611 may be MOS switches.

For example, each transistor 611 is provided for the corresponding one of the global word lines GWL of the memory block MB. When the memory block MB is connected to k global word lines GWLL and GWLU, the word line equalizer 610 includes k transistors 611.

As illustrated in FIG. 6, when one word line equalizer 610 is connected to two memory blocks MB, one end of the transistor 611 is connected to the corresponding global word line GWLa of the memory block MBa, and the other end of the transistor 611 is connected to the corresponding global word line GWLb of the memory block MBb.

As described in the present embodiment, when each memory cell block (memory cell array) MB includes the two array layers LYL and LYU, each transistor 611 is connected to the array layers LYL and LYU at different levels (heights).

For example, when one end of the transistor 611 is connected to the global word line GWLLa corresponding to the lower array layer LYL of the memory block MBa, the other end of the transistor 611 is connected to the global word line GWLUb corresponding to the upper array layer LYU of the memory block MBb. When one end of the transistor 611 is connected to the global word line GWLUa corresponding to the upper array layer LYU of the memory block MBa, the other end of the transistor 611 is connected to the global word line GWLLb corresponding to the lower array layer LYL of the memory block MBb.

The control signal EQR (EQR<0>, EQR<1>, . . . , EQR<k-2>, EQR<k-1>) is supplied to the gate of the corresponding transistor 611. The transistor 611 is controlled to be turned on and off in accordance with the signal level of the control signal EQR.

For example, the signal level of the control signal EQR is controlled by the control circuit 190 in accordance with decoding results of the addresses of the global word lines GWLL and GWLU. Accordingly, the on and off states of the transistor 611 corresponding to the selected global word lines GWLL and GWLU are controlled.

When the transistor 611 is in the on state, the two global word lines GWLUa and GWLLb connected to the common transistor 611 are electrically connected to each other. When the transistor 611 is in the off state, the two global word lines GWLa and GWLb connected to the common transistor 611 are electrically separated from each other.

For example, a hierarchical bit-line structure is used for columns of each memory block MB.

The memory blocks MBa and MBb having the hierarchical bit-line structure each include a plurality of global bit lines GBLa and GBLb and a plurality of bit lines (hereinafter referred to as local word lines) BL.

The global bit lines GBLa and GBLb are each connected to the corresponding one of a plurality of selectors 221 (221*a* and 221*b*) in the bit-line selection circuit 122. The bit lines BLa and BLb are connected to the corresponding selector 221. A selection signal SC is supplied to each selector 221. The selection signal SC is a signal obtained from a decoding result of a column address in the address ADR. Accordingly, one of the bit lines BLa and BLb is selected.

For example, the global bit lines GBL are connected to the global bit-line selection circuit 121. Accordingly, one of the global bit lines GBL, which corresponds to the decoding result of the address ADR is selected.

The global bit lines GBL are connected to the driver circuits 141 and 151. The driver circuits 141 and 151 supply various kinds of voltage to the bit lines BL through the global bit lines GBL in accordance with executed operation.

The global bit lines GBLa and GBLb are connected to the bit line equalizer 620.

The bit line equalizer 620 includes one or more switching elements 621.

The switching elements 621 are, for example, transistors (or MOS switches).

For example, each transistor 621 is provided for the corresponding one of the global bit lines GBL (GBLa and GBLb) of the memory block MB. When the memory block MB is connected to j global bit lines GBL, the bit line equalizer 620 includes j transistors 621.

As illustrated in FIG. 6, when the bit line equalizer 620 is connected to the two memory blocks MBa and MBb, one end of each transistor 621 is connected to the corresponding global bit line GBLa of the memory block MBa, and the other end of the transistor 621 is connected to the corresponding global bit line GBLb of the memory block MBb.

The control signal EQC (EQC <0>, . . . , EQC <j−1>) is supplied to the gate of the corresponding transistor 621. The transistor 621 is controlled to be turned on and off in accordance with the signal level of the control signal EQC.

For example, the signal level of the control signal EQC is controlled by the control circuit 190 in accordance with a decoding result of the address of the global bit line GBL. Accordingly, the on and off states of the transistor 621 corresponding to the selected global bit line GBL are controlled.

When the transistor 621 is in the on state, the two global bit lines GBLa and GBLb are electrically connected to each other. When the transistor 621 is in the off state, the two global bit lines GBLa and GBLb are electrically isolated from each other.

In two different memory blocks of the magnetoresistive random access memory according to the present embodiment after execution of certain operation, two selected bit lines are set to an opposite voltage relation and two selection word lines are set to an opposite voltage relation through operation described below. The magnetoresistive random access memory according to the present embodiment performs interconnect precharge by using charge shear between bit lines and charge shear between word lines.

Accordingly, the magnetoresistive random access memory according to the present embodiment can reduce energy (for example, electric power consumption) for interconnect charging.

(b-2) Operation Example

An operation example of the memory device (for example, a magnetoresistive random access memory) of the present embodiment will be described below with reference to FIGS. 7 to 12.

(b-2.1) Write Operation

The write operation of the magnetoresistive random access memory according to the present embodiment will be described below with reference to FIGS. 7 to 10. As described above, in the write operation of the magnetoresistive random access memory, the P write and the AP write are executed in accordance with data to be written.

P Write

The P write at the magnetoresistive random access memory according to the present embodiment will be described below with reference to FIGS. 7 and 8.

Figure 7:
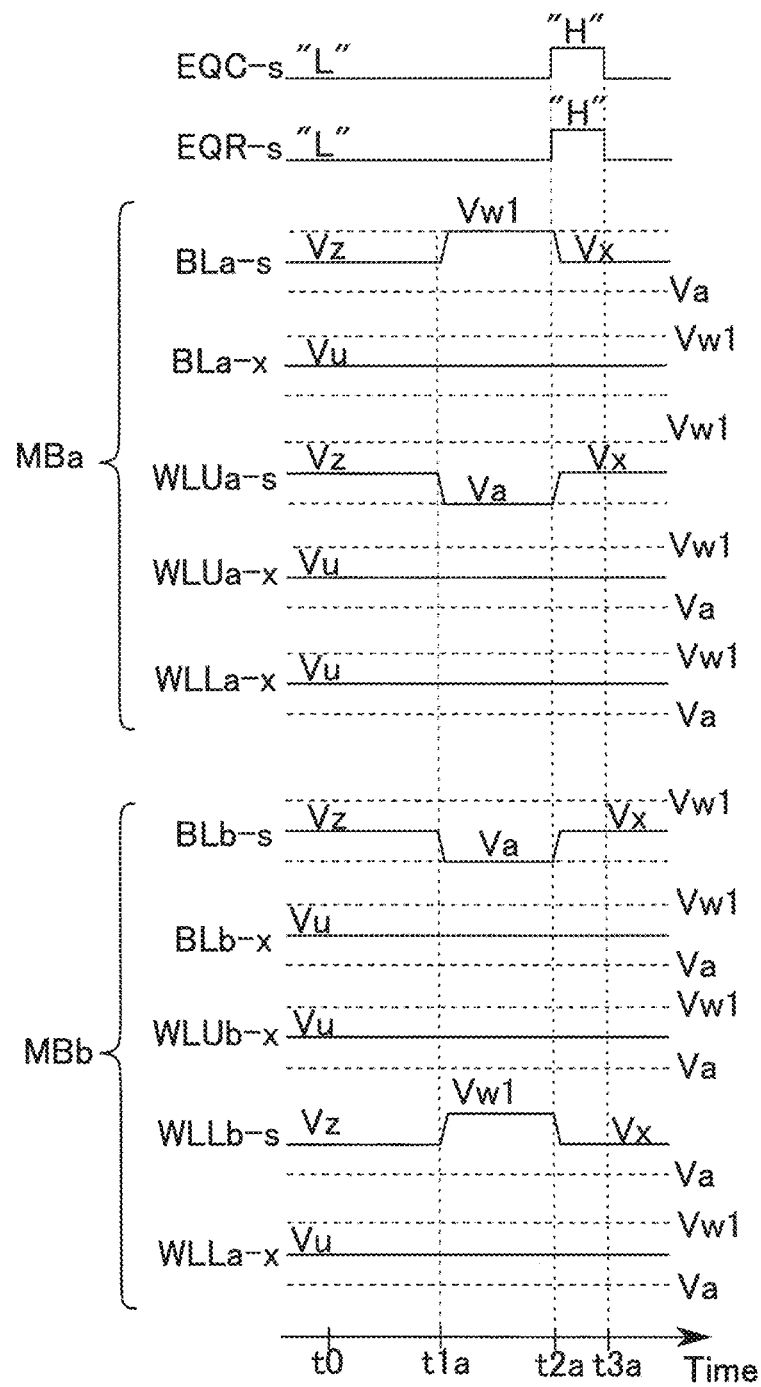
FIG. 7 is a timing chart illustrating an operation example of the memory device of the first embodiment.

FIG. 7 is a timing chart for description of a write operation example of the memory device of the present embodiment.

Figure 8:
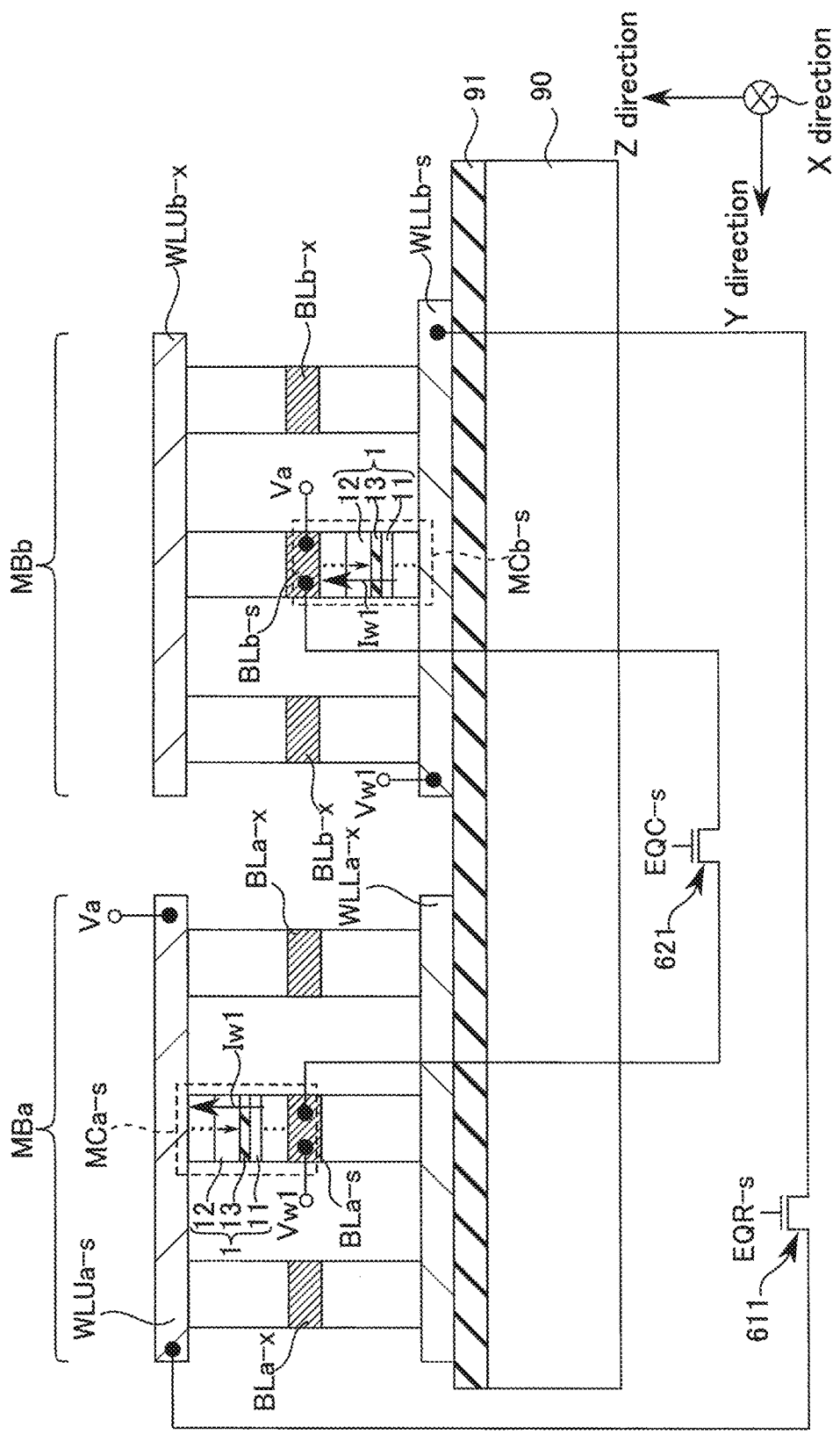
FIG. 8 is a diagram for description of the operation example of the memory device of the first embodiment.

FIG. 8 is a pattern diagram for description of the operation example of the memory device of the present embodiment. In FIG. 8, six memory cells of each memory block are extracted and illustrated for simplification of illustration.

Time t0

At time t0, the processor 900 transfers the command CMD, the address ADR, data (write data), and various control signals CNT to the magnetoresistive random access memory 1.

The magnetoresistive random access memory 1 receives the command CMD, the address ADR, the write data, and the control signals CNT.

The magnetoresistive random access memory 1 executes write operation (in this example, the P write) on a memory cell indicated by the address ADR based on the command CMD and the control signals CNT.

The control circuit 190 transfers a decoding result of the command CMD to each circuit. The control circuit 190 transfers a decoding result of the address ADR to the row control circuit 110 and the column control circuit 120.

The voltage generator 170 generates various kinds of voltage based on the decoding result of the command CMD.

The row control circuit 110 and the column control circuit 120 control activation and deactivation of the memory blocks MB and the interconnects in the memory cell array 100 based on the address decoding result.

In the present embodiment, operation is executed in parallel on the memory blocks MB in units of data write (for example, units of pages).

As illustrated in FIG. 8, the array layers LYL and LYU at levels different from each other are selected in the two memory blocks MBa and MBb connected to the common word line equalizer 610 and the common bit line equalizer 620 and operated in parallel.

When each memory block MB includes the two array layers LYL and LYU, the upper array layer LYU of the one memory block MBa is selected and the lower array layer LYL of the other memory block MBb is selected.

Based on the decoding result of the address ADR, a bit line BLa-s and a word line WLUa-s in the upper array layer LYU of the memory block MBa are selected by selectors 220a and 221a to which the signals SR and SC are supplied.

Based on the decoding result of the address ADR, a bit line BLb-s and a word line WLLb-s in the lower array layer LYL of the memory block MBb are selected by selectors 220b and 221b to which the signals SR and SC are supplied.

Accordingly, memory cells MCUa-s and MCLb-s as operation targets are selected from each of the memory blocks MBa and MBb.

Hereinafter, a memory cell as an operation target is referred to as a selected cell. A bit line connected to the selected cell is referred to as a selected bit line. A word line connected to the selected cell is referred to as a selected word line. Any memory cell other than the selected cell is referred to as a non-selected cell. Any bit line other than the selected bit line is referred to as a non-selected bit line, and any word line other than the selected word line is referred to as a non-selected word line.

For example, before execution of operation, the potentials of each bit line BL and each word line in initial states are set to a voltage value Vz.

Time t1a

At time t1a, voltage supply for the write operation to the selected memory blocks MBa and MBb is started.

Voltage for executing the write operation (P write) is applied to the selected bit lines BLa-s and BLb-s and the selected word lines WLUa-s and WLLb-s.

In the present embodiment, same operation is executed in parallel on selected cells MCUa and MCLb of the different levels LYU and LYL of the selected memory blocks MBa and MBb.

When data is written to a memory cell including an MTJ element through the STT, the data depends on the polarity (current flow direction) of write current to the MTJ element.

As illustrated in FIG. 5 described above, the order of disposition of the storage layer 11 and the reference layer 12 in the Z direction is set to be same between the MTJ element of the upper array layer LYU and the MTJ element of the lower array layer LYL.

Accordingly, in the magnetoresistive random access memory according to the present embodiment, write (the AP write or the P write) of the same data can be executed to the selected cells MCUa and MCLb of the different levels LYU and LYL of the memory blocks MBa and MBb operated in parallel.

In the P write, the potential of a selected bit line and the potential of a selected word line are controlled so that write current Iw1 flows from the storage layer 11 to the reference layer 12 of the MTJ element 1.

As illustrated in FIG. 8, in the memory block MBa, voltage Vw1 is applied to the selected bit line BLa-s, and voltage Va is applied to the selected upper word line WLUa-s in the upper array layer LYU.

In the present embodiment, for example, the voltage Vw1 is supplied from the driver circuit 141 of the write circuit 140 to the selected bit line BLa-s in the memory block MBa through the global bit line GBLa-s corresponding to the address ADR. The voltage Va is supplied from the driver circuit 141 of the write circuit 140 to a selected word line WLa-s in the memory block MBa through the global word line GWLUa-s corresponding to the address ADR.

The voltage Vw1 has a positive voltage value. The voltage Va has 0 V or a negative voltage value. Accordingly, voltage VP corresponding to the potential difference between the voltage Vw1 and the voltage Va is applied to the selected cell MCUa-s. With the voltage VP, the current Iw1 flows inside a selected cell MCUa-s. Accordingly, data is written to the selected cell MCUa-s.

The voltage VAP has a voltage value for generating current (write current) that changes the magnetization arrangement state of the MTJ element in the selection cell from the AP state to the P state.

In the memory block MBa, the write current Iw1 flows from the selected bit line BLa-s toward the selected upper word line WLUa-s.

Voltage is supplied to the memory block MBb in parallel with the voltage supply to the memory block MBa.

In the memory block MBb, the voltage Vw1 is applied to the selected word line WLLb-s in the lower array layer LYL, and the voltage Va (<Vw1) is applied to the selected bit line BLb-s.

The voltage Vw1 is supplied from the driver circuit 141 to the selected word line WLLb-s in the memory block MBb through the global word line GWLLb corresponding to the address ADR. The voltage Va is supplied from the driver circuit 141 to the selected bit line BLb-s in the memory block MBb through the global bit line GWLb corresponding to the address ADR.

The voltage value of the voltage Vw1 applied to the selected word line WLLb-s of the memory block MBb may be different from the voltage value of the voltage Vw1 applied to the selected bit line BLa-s of the memory block MBa. The voltage value of the voltage Va applied to the selected bit line BLb-s of the memory block MBb may be different from the voltage value of the voltage Va applied to the selected word line WLUa-s of the memory block MBa. However, in this case as well, it is satisfied that the potential difference between the selected word line and the selected bit line is equal to the voltage VP.

Similarly to the selected cell MCUa-s in the memory block MBa, the voltage VP corresponding to the potential difference between the voltage Vw1 and the voltage Va is applied to the selected cell MCLb-s in the memory block MBb. The current Iw1 flows inside the selected cell MCLb-s. Accordingly, data is written to the selected cell MCLb-s.

In the memory block MBb, the write current Iw1 flows from the selected lower word line WLLb-s toward the selected bit line BLb-s.

In this manner, in the present embodiment, the write current Iw1 flows from the storage layer 11 to the reference layer 12 of the MTJ element 1. The current for the P write to a selected cell in the upper array layer LYU flows from the bit line BL to the upper word line WLU. Write current for the P write to a selected cell in the lower array layer flows from the lower word line WLL to the bit line BL.

In P write operation, non-selected voltage Vu may be applied to non-selected bit lines BLa-x and BLb-x and non-selected word lines WLLa-x, WLLb-x, WLUa-x, and WLUb-x. For example, the voltage value of the voltage Vu is set as appropriate so that the potential difference between the voltage Vu and the voltage Vw1 and the potential difference between the voltage Vu and the voltage Va are smaller than an on voltage of the switching element 2. Accordingly, the occurrence of noise to the selected cell MC-s and false write to any non-selected cell MC-s is reduced.

Time t2a

At time t2a after the write current Iw1 is supplied to a memory cell in a predetermined duration (the pulse width of the write current), the control circuit 190 changes, from an "L" level to a "H" level based on the address ADR, the signal level of an equalization signal EQC-s corresponding to a selected bit line BL-s and the signal level of an equalization signal EQR-s corresponding to a selected word line WL-s.

With the equalization signal EQC-s at the "H" level, the bit line equalizer 620 electrically connects the selected bit line BLa-s in the memory block MBa with the selected bit line BLb-s in the memory block MBb through the transistor 621 in the on state.

Charge shear occurs between the bit line BLa-s to which the voltage Vw1 is applied and the bit line BLb-s to which the voltage Va is applied. The potentials of the selected bit lines BLa-s and BLb-s change to potentials between the voltage Vw1 and the voltage Va.

Accordingly, the potential of the selected bit line BLa-s decreases from the voltage Vw1 to a voltage Vx approximately, and the potential of the selected bit line BLb-s increases from the voltage Va to the voltage Vx approximately. For example, the voltage Vx is higher than 0 V.

When the magnitude of a bit-line interconnect capacitance of the memory block MBa is substantially equal to the magnitude of a bit-line interconnect capacitance of the memory block MBb, the voltage Vx has a voltage value (for example, the voltage value Vz) equal to the potentials of the selected bit lines BLa-s and BLb-s before application of the voltage Vw1 and the voltage Va approximately.

With the equalization signal EQR-s at the "H" level, the word line equalizer 610 electrically connects the selected word line WLUa-s in the memory block MBa to the selected word line WLLb-s in the memory block MBb through the transistor 611 in the on state.

Charge shear occurs between the lower word line WLLb-s to which the voltage Vw1 is applied and the upper word line WLUa-s to which the voltage Va is applied. The potentials of the selection word lines WLUa-s and WLLb-s change to potentials between the voltage Vw1 and the voltage Va.

Accordingly, the potential of the selected upper word line WLLa-s increases from the voltage Va to the voltage Vx (for example, Vx>0 V) approximately, and the potential of the selected lower word line WLLb-s decreases from the voltage Vw1 to the voltage Vx approximately.

When the magnitude of a word-line interconnect capacitance of the memory block MBa is substantially equal to the magnitude of a word-line interconnect capacitance of the memory block MBb, the voltage Vx has a voltage value (for example, the voltage value Vz) equal to the potentials of the selected word lines WLUa-s and WLLb-s before application of the voltage Vw1 and the voltage Va approximately.

In this manner, in the present embodiment, charge shear between a high-potential bit line and a low-potential bit line in different blocks leads to precharge of the low-potential bit line. In addition, in the present embodiment, charge shear between a high-potential word line and a low-potential word line in different blocks leads to precharge of the low-potential word line.

Time t3a

At time t3a, the control circuit 190 changes the signal levels of the equalization signals EQC-s and EQR-s from the "H" level to the "L" level.

The transistor 621 in the off state electrically isolates the selected bit line BLa-s in the memory block MBa from the selected bit line BLb-s in the memory block MBb. The transistor 611 in the off state electrically isolates the selected word line WLUa-s in the memory block MBa from the selected word line WLLb-s in the memory block MBb.

In a duration from time t3a to execution of the next operation, the bit lines BLa-s and BLb-s and the word lines WLUa-s and WLLb-s each maintain a state (precharge state) in which the voltage Vx is applied.

In this manner, the P write at the magnetoresistive random access memory according to the present embodiment is completed.

In the P write, the memory cell MCL in the lower array layer of the memory block MBa and the memory cell MCU in the upper layer array of the memory block MBb may be simultaneously selected. For example, in the memory block MBa, the voltage Va is applied to the selected bit line BLa-s, and the voltage Vw1 (>Va) is applied to the selected lower word line WLLa-s. In the memory block MBb, the voltage Va is applied to a selected upper word line WLUb-s, and the voltage Vw1 is applied to the selected bit line BLb-s. In this case as well, substantially similarly to the example in FIGS. 7 and 8, charge shear between interconnects is executed after supply of write current for the P write.

AP Write

The AP write at the magnetoresistive random access memory according to the present embodiment will be described below with reference to FIGS. 9 and 10.

Figure 9:
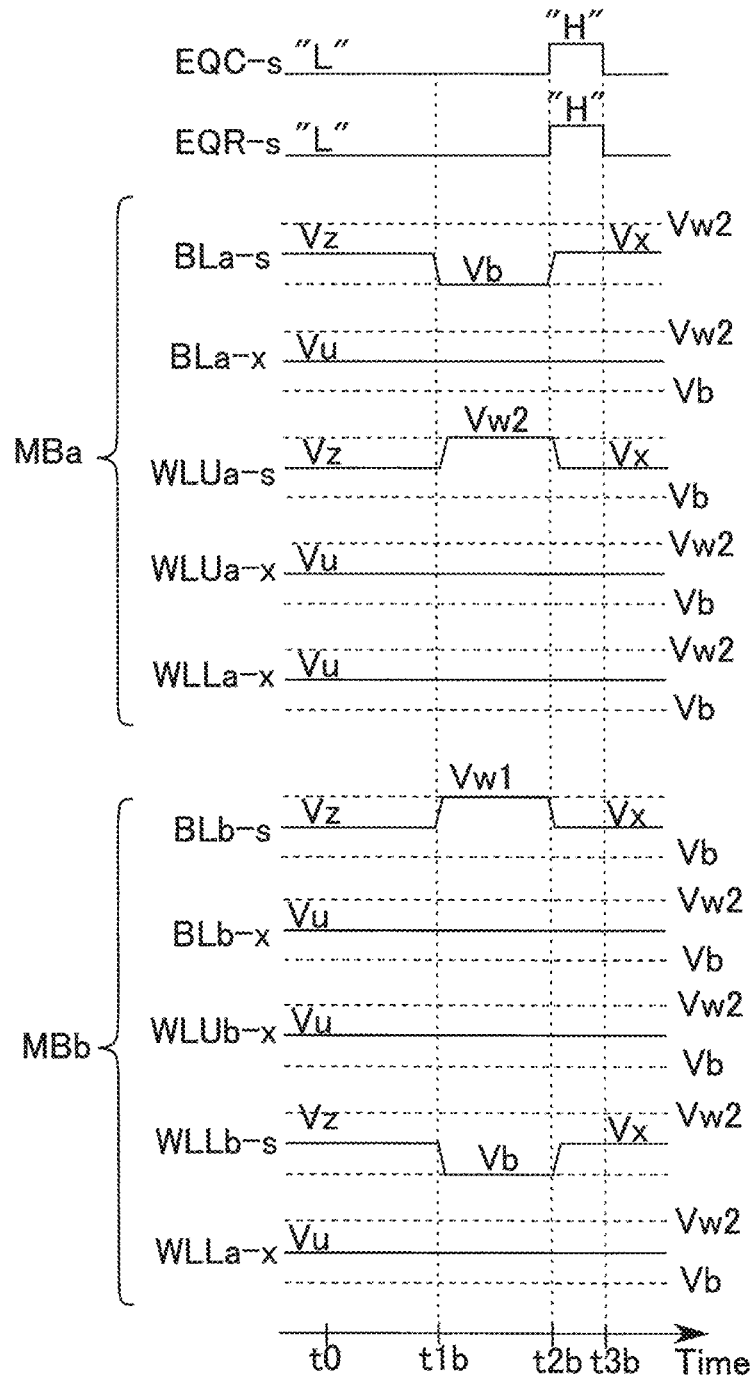
FIG. 9 is a timing chart illustrating the operation example of the memory device of the first embodiment.

FIG. 9 is a timing chart for description of a write operation example of the memory device of the present embodiment.

Figure 10:
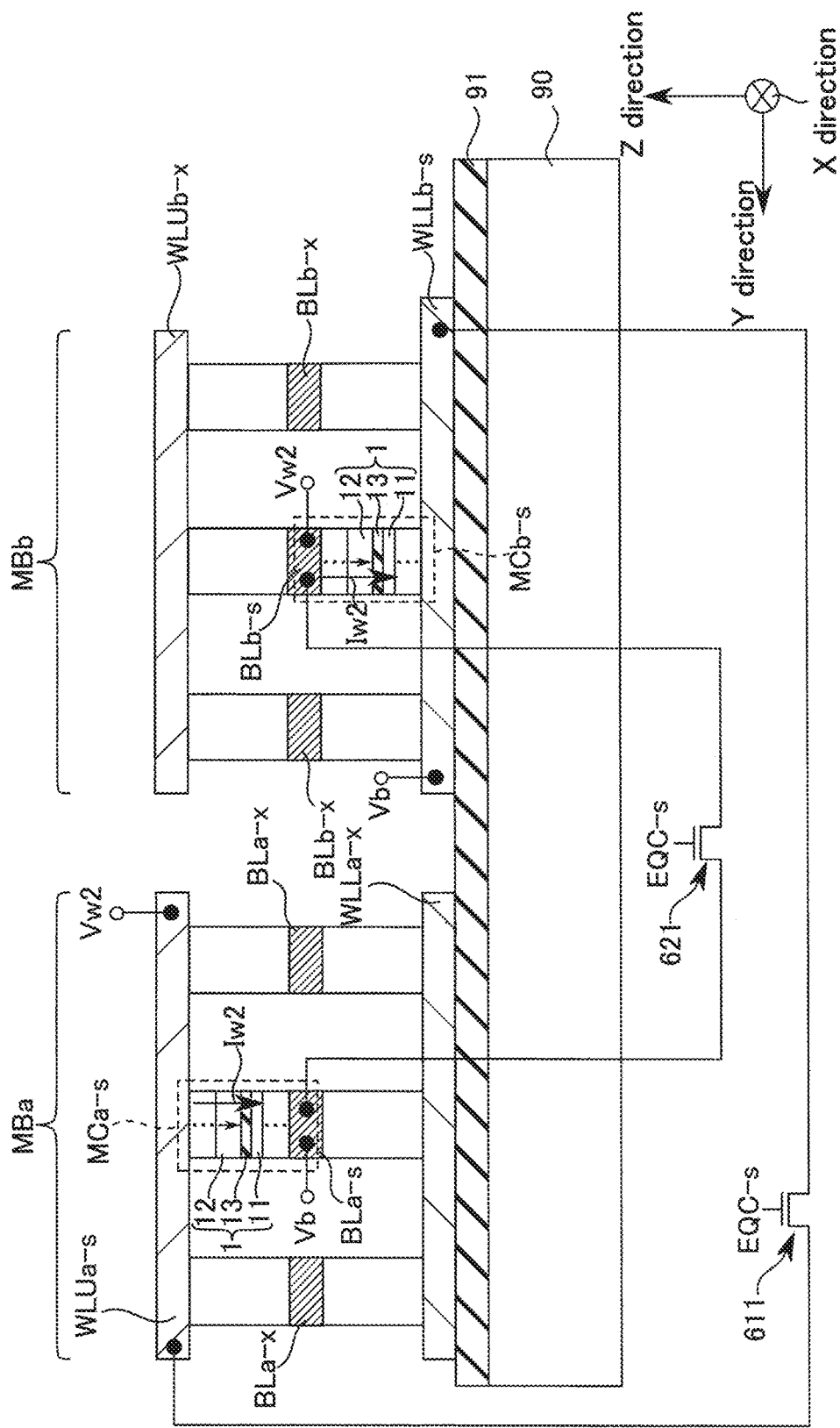
FIG. 10 is a diagram for description of the operation example of the memory device of the first embodiment.

FIG. 10 is a pattern diagram for description of the operation example of the memory device of the present embodiment. In FIG. 10, six memory cells of each memory block are extracted and illustrated for simplification of illustration.

The AP write at the magnetoresistive random access memory is different from the P write at the magnetoresistive random access memory in the potential relation between a word line and a bit line.

Time t1b

For example, similarly to the example in FIGS. 7 and 8, after command and address reception (time t0), the memory cell MCUa in the upper array layer LYU of the memory block MBa and the memory cell MCLb in the lower array layer LYL of the memory block MBb are selected.

As illustrated in FIGS. 9 and 10, at time t1b, in the memory block MBa, voltage Vw2 is applied to a selected upper word line WLU-s, and voltage Vb is applied to the selected bit line BL-s.

For example, the voltage Vw2 is supplied from the driver circuit 141 to the selected word line WLUa-s in the memory block MBa through the global word line GWLUa-s corresponding to the address ADR. The voltage Vb is supplied from the driver circuit 141 to the selected bit line BLa-s in the memory block MBa through the global bit line GBLa-s corresponding to the address ADR.

The voltage Vw2 has a positive voltage value. The voltage Vb has 0 V or a negative voltage value. The voltage Vw2 is higher than the voltage Vb. For example, the voltage value of the voltage Vw2 may be equal to the voltage value of the voltage Vw1. The voltage value of the voltage Vb may be equal to the voltage value of the voltage Va. For example, when the voltage value of the voltage Vb is substantially equal to the voltage value of the voltage Va, the voltage value of the voltage Vw2 is substantially equal to the voltage value of the voltage Vw1.

In the memory block MBb, the voltage Vw2 is applied to the selected bit line BLb-s, and the voltage Vb is applied to the selected lower word line WLLb-s.

For example, the voltage Vw2 is supplied from the driver circuit 141 to the selected bit line BLb-s in the memory block MBb through a global bit line GBLb-s corresponding to the address ADR. The voltage Vb is supplied from the driver circuit 141 to the selected word line WLLb-s in the memory block MBb through a global word line GWLLb-s corresponding to the address ADR.

In this manner, in the memory block MBa, the potential relation between the selected bit line BLa-s and the selected word line WLUa-s at the AP write is opposite to the potential relation between the selected bit line BLa-s and the selected word line WLUa-s at the P write. Similarly, in the memory block MBb, the potential relation between the selected bit line BLb-s and the selected word line WLLb-s at the AP write is opposite to the potential relation between the selected bit line BLb-s and the selected word line WLLb-s at the P write.

However, current flowing inside the selected cell MCUa-s and current flowing inside the selected cell MCLb-s flow in the same direction (direction from the upper word line side toward the lower word line side).

The voltage value of the voltage Vw2 applied to the selected bit line BLb-s of the memory block MBb may be different from the voltage value of the voltage Vw2 applied to the selected word line WLUa-s of the memory block MBa. The voltage value of the voltage Vb applied to the selected word line WLLb-s of the memory block MBb may be different from the voltage value of the voltage Vb applied to the selected bit line BLa-s of the memory block MBa. However, in this case as well, it is satisfied that the potential difference between the selected word line and the selected bit line is equal to voltage VAP.

Times t2b and t3b

At the AP write, similarly to the P write, charge shear is executed between the bit lines and between the word lines after supply of write current.

At time t2b, the control circuit 190 changes the signal levels of the equalization signals EQC-s and EQR-s corresponding to selected cells MCa-s and MCb-s from the "L" level to the "H" level based on the address ADR. The equalization signals EQC-s and EQR-s at the "H" level set the corresponding transistors 611 and 621 to the on state.

The selected bit line BLa-s is electrically connected to the selected bit line BLb-s through the transistor 621 in the on state. Due to charge shear between the bit lines, the potential of the selected bit line BLa-s increases to the voltage Vx approximately, and the potential of the selected bit line BLb-s decreases to the voltage Vx approximately.

The selected upper word line WLUa-s is electrically connected to the selected lower word line WLLb-s through the transistor 611 in the on state. Due to charge shear between the word lines, the potential of the selected word line WLUa-s decreases to the voltage Vx approximately, and the potential of the selected word line WLLb-s increases to the voltage Vx approximately.

At time t3b, the control circuit 190 changes the signal levels of the equalization signals EQC-s and EQR-s from the "H" level to the "L" level. Accordingly, the bit lines and the word lines in the memory block MBa are electrically isolated from the bit lines and the word lines in the memory block MBb, respectively.

The bit lines BL and the word lines WL are maintained in the precharge state for a duration until the next operation is executed after time t3b.

As described in the present embodiment, at the AP write, bit lines and word lines are precharged due to charge shear between bit lines of different memory blocks and charge shear between word lines of different memory blocks.

In this manner, the AP write at the magnetoresistive random access memory according to the present embodiment is completed.

At the AP write, similarly to the P write, the memory cell MCL in the lower array layer of the memory block MBa and the memory cell MCU in the upper layer array of the memory block MBb may be simultaneously selected.

(b-2.2) Read Operation

The read operation of the magnetoresistive random access memory according to the present embodiment will be described below with reference to FIGS. 11 and 12.

Figure 11:
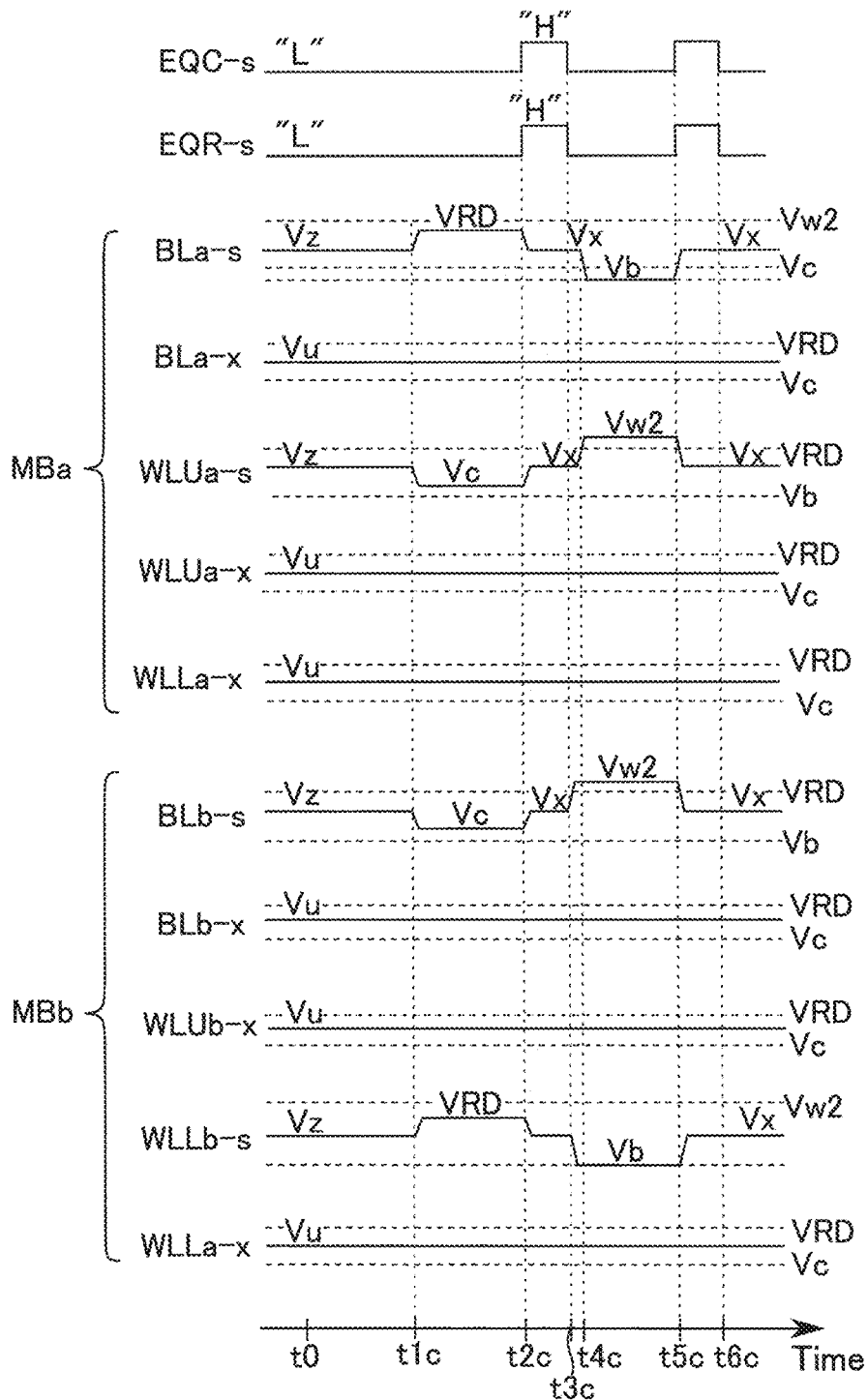
FIG. 11 is a timing chart illustrating the operation example of the memory device of the first embodiment.

FIG. 11 is a timing chart for description of a read operation example of the memory device of the present embodiment.

FIG. 12 is a pattern diagram for description of the operation example of the memory device of the present embodiment. In FIG. 12, six memory cells of each memory block are extracted and illustrated for simplification of illustration.

Time t1c

Substantially similarly to the write operation, after command and address reception (time t0), the memory cell MCUa in the upper array layer LYU of the memory block MBa and the memory cell MCLb in the lower array layer LYL of the memory block MBb are selected based on the decoding result of the address ADR (for example, the signals SR and SC).

As illustrated in FIGS. 11 and 12, at time t1c, in the memory block MBa, read voltage VRD is applied to the selected bit line BLb-s, and voltage Vc is applied to the selected upper word line WLUa-s.

For example, the read voltage VRD is supplied from the driver circuit 151 of the read circuit 150 to the selected bit line BLa-s in the memory block MBa through the global bit line GBLa-s corresponding to the address ADR. The voltage Vc is supplied from the driver circuit 151 to the selected upper word line WLUa-s in the memory block MBa through the global word line GWLUa-s corresponding to the address ADR.

The read voltage VRD is positive voltage. The voltage Vc has a voltage value equal to or lower than 0 V. The voltage value of the read voltage VRD is higher than the voltage value of the voltage Vc. The voltage value of the read voltage VRD and the voltage value of the voltage Vc are set so that the current value of current (read current) generated due to the potential difference between the read voltage VRD and the voltage Vc is smaller than the magnetization switching threshold value of the storage layer 11.

In the memory block MBb, the read voltage VRD is applied to the selected lower word line WLLb-s in the lower array layer LYL, and the voltage Vc (<VRD) is applied to the selected bit line BLb-s.

For example, the read voltage VRD is supplied from the driver circuit 151 to the selected lower word line WLLb-s in the memory block MBb through the global word line GWLLb. The voltage Vc is supplied from the driver circuit 151 to the selected bit line BLb-s in the memory block MBb through the global bit line GBLb.

For example, in the read operation, similarly to the write operation, the non-selected voltage Vu may be applied to non-selected bit lines BL-x and non-selected word lines WLU-x and WLL-x.

In the memory block MBa, read current IRD flows from the selected bit line BLa-s toward the selected upper word line WLUa-s.

In the memory block MBb, the read current IRD flows from the selected lower word line WLLb-s toward the selected bit line BLb-s.

Data in the selected cells MCa-s and MCb-s of the memory blocks MBa and MBb is determined based on results of sensing of read current IRDa and the read current IRDb.

Accordingly, the data is read from the memory blocks MB.

In the present embodiment, the flow direction of the read current IRDa flowing inside the selected cell MCUa in the upper array layer LYU of one memory block MBa is same as the flow direction of the current IRDb flowing inside the selected cell MCLb in the lower array layer LYL of the other memory block MBb.

The read current IRDa and the read current IRDb flow from the lower word line side toward the upper word line side.

However, in the potential relation (bias state) between each bit line BL and the corresponding word line WL at application of the read voltage VRD, the bias state between the bit line BLa-s and the upper word line WLUa-s of the memory block MBa is different from the bias state between the bit line BLb-s and the lower word line WLLb-s of the memory block MBb.

In the memory block MBa, the potential of the selected bit line BLa-s is higher than the potential of the upper word line WLUa-s. However, in the memory block MBb, the potential of the selected bit line BLa-s is lower than the potential of the lower word line WLLa-s.

The voltage value of the voltage VRD applied to the selected bit line BLb-s of the memory block MBb may be different from the voltage value of the voltage VRD applied to the selected word line WLUa-s of the memory block MBa. In addition, the voltage value of the voltage Vc applied to the selected word line WLLb-s of the memory block MBb may be different from the voltage value of the voltage Vc applied to the selected bit line BLa-s of the memory block MBa. However, in this case as well, it is satisfied that the potential difference between the selected word line and the selected bit line is enough to generate read current.

Time t2c

After the data reading, charge shear is executed between interconnects.

The control circuit 190 controls the signal levels of the equalization signals EQC-s and EQR-s based on the decoding result of the address ADR. Accordingly, the transistors 611 and 621 corresponding to the selected global word line GWL and the selected global bit line GBL are set to the on state.

For example, the control circuit 190 transfers the equalization signal EQR-s at the "H" level to the word line equalizer 610. The equalization signal EQR-s at the "H" level is supplied to the transistor 611 connected to the selected upper word line WLU-s of the memory block MBa and the selected lower word lines WLL-s of the memory block MBb. The transistor 611 is set to the on state.

Accordingly, the upper word line WLUa-s to which the voltage Vc is applied is electrically connected to the lower word line WLLb-s to which the voltage VRD is applied.

Thus, charge shear occurs between the selected word line WLLb-s at high potential and the selected word line WLUa-s at low potential.

For example, in parallel charge shear between the word lines WLUa and WLLb, the control circuit 190 transfers the equalization signal EQC-s at the "H" level to the bit line equalizer 620. The equalization signal EQC-s at the "H" level is supplied to the transistor 621 connected to the selected bit line BLa-s of the memory block MBa and the selected bit line BLb-s of the memory block MBb.

Accordingly, the bit line BLa-s to which the voltage VRD is applied is electrically connected to the bit line BLb-s to which the voltage Vc (<VRD) is applied.

Thus, charge shear occurs between the selected bit line BLa-s at high potential and the selected bit line BLb-s at low potential. Due to the charge shear, the potential of the bit line BLa-s decreases, and the potential of the bit line BLb-s increases.

As a result, the potentials of the two bit lines BLa-s and BLb-s become substantially equal to each other. For example, the potentials of the bit lines BLa and BLb are equal to the voltage Vx approximately.

When a memory cell in the lower array layer of the memory block MBa is selected and a memory cell in the upper array layer of the memory block MBb is selected, the voltage VRD is applied to the selected lower word line WLLa of the memory block MBa and the selected bit line of the memory block MBb, and the voltage Vc is applied to the selected bit line BLa in the memory block MBa and the selected upper word line of the memory block MBb. In this case as well, the word line equalizer 610 and the bit line equalizer 620 are controlled so that charge shear occurs between the bit lines and between the upper and lower word lines.

Time t3c

The control circuit 190 changes the signal levels of the equalization signals EQC-s and EQR-s corresponding to the selected address ADR from the "H" level to the "L" level. The equalization signals EQR-s and EQC-s at the "L" level are supplied to the word line equalizer 610 and the bit line equalizer 620, respectively. The corresponding transistors 611 and 621 are set to the off state.

The transistor 611 in the off state electrically isolates the upper word line WLUa-s of the memory block MBa from the lower word line WLLb-s of the memory block MBb. The transistor 621 in the off state electrically isolates the bit line BLa-s of the memory block MBa from the bit line BLb-s of the memory block MBb.

Accordingly, charge shear between interconnects ends.

In this manner, after data reading, the bit lines BL and the word lines WL are precharged through charge shear between interconnects.

Time t4c

In the read operation of the magnetoresistive random access memory according to the present embodiment, after the data reading and then the precharge through charge shear, write-back processing is executed on a selected cell from which data is read.

Through the write-back processing, write current is supplied to the selected cell to which the read current IRD is supplied.

In the write-back processing, the potentials of the selected bit line and the selected word line are set so that the write current flows inside the selected cell in a direction opposite to the direction in which the read current flows inside the selected cell.

In the example illustrated in FIGS. 11 and 12, the read current in the memory block MBa flows from the selected bit line BLa-s to the selected upper word line WLUa-s, and the read current in the memory block MBb flows from the selected lower word line WLLb-s to the selected bit line BLb-s.

Thus, in the write-back processing, in the memory block MBa, the voltage Vw2 is applied to the selected upper word line WLUa-s, and the voltage Vb is applied to the selected bit line BLa-s. In the memory block MBb, the voltage Vw2 is applied to the selected bit line BLb-s, and the voltage Vb is applied to the selected lower word line WLLb-s.

Accordingly, similarly to the AP write in FIG. 10, the write current flows in a direction from the reference layer 12 toward the storage layer 11 in the MTJ element of the selection cell.

Through the write-back processing, any magnetization inversion error unintentionally occurring to the storage layer attributable to the read current is corrected.

In the present embodiment, word lines and bit lines are precharged through charge shear between the voltages of interconnects in the previous operation (in this example, data reading). Thus, in the write-back processing executed continuously with the data reading, the amount of charging of interconnects (in this example, the word line WLUa and the bit line BLb) set to high potential is smaller than the amount of charging from the bias state of 0 V to predetermined voltage.

In this manner, the memory device of the present embodiment can reduce the energy of interconnect charging for operation.

Time t5c

After the write current supply in the write-back processing, charge shear is executed.

Substantially similarly to the charge shear after the data reading, the word line equalizer 610 and the bit line equalizer 620 execute charge shear between bit lines and between word lines based on the equalization signals EQC-s and EQR-s from the control circuit 190.

Accordingly, the read operation of the magnetoresistive random access memory according to the present embodiment is completed.

In the magnetoresistive random access memory according to the present embodiment, the read operation may be executed so that the read current flows from the reference layer side to the storage layer side in the MTJ element. At the read current supply, the voltage Vc is supplied to the selected bit line BLa-s of the memory block MBa and the selected lower word line WLLb-s of the memory block MBb, and the voltage VRD is supplied to the selected upper word line WLU-s of the memory block MBa and the selected bit line BLb-s of the memory block MBb. In this case, the write-back processing by the P write is executed so that the write current flows from the storage layer side to the reference layer side in the MTJ element.

In the read operation, when the memory cell MCL in the lower array layer of the memory block MBa and the memory cell MCU in the upper layer array of the memory block MBb are simultaneously selected, the predetermined voltage VRD and voltage Vc are applied to the bit lines and the word lines to satisfy the potential relation between interconnects. Accordingly, the data reading, the charge shear, and the write-back processing are sequentially executed.

(c) CONCLUSION

Typically, parasitic capacitance in a memory array tends to increase with a shrink of elements and interconnects and increase of the size of a memory cell array. Interconnect charging energy potentially increases along with the parasitic capacitance increase.

The memory device of the present embodiment includes a memory cell array including a plurality of memory blocks. Each memory block includes a plurality of array layers. A plurality of memory cells are arrayed in each array layer.

In at least one of write operation and read operation, the memory device of the present embodiment operates array layers at different levels of the different memory blocks in parallel.

At operation to be executed, the memory device of the present embodiment sets high potential to a selected bit line and low potential to a selected word line in a selected array layer of one of the memory blocks. In parallel, the memory device of the present embodiment sets low potential to a selected bit line and high potential to a selected word line in a selected array layer of the other memory block.

After predetermined operation, the memory device of the present embodiment electrically connects the selected bit line of the one memory block with the selected bit line of the other memory block. Accordingly, charge shear occurs between the bit lines, and the potentials of the selected bit lines of the two memory blocks are set to a value between the high potential and the low potential before the charge shear.

Similarly, the memory device of the present embodiment electrically connects the selected word line of the one memory block to the selected word line of the other memory block. Accordingly, through charge shear between the word lines, the potentials of the selected word lines of the two memory blocks are set to a value between the high potential and the low potential before the charge shear.

In this manner, in the present embodiment, the charge shear of the voltages used for operation between the bit lines and between the word lines reduces energy (for example, electrical power) to charge the bit lines and the word lines.

In the memory device of the present embodiment, when the difference (imbalance) between a bit-line interconnect capacitance and a word-line interconnect capacitance is large, applied voltage is different between a plurality of bit lines operated in parallel and between a plurality of word lines operated in parallel, which reduces noise generated at a power source. In this case, in the memory device of the present embodiment, restriction on disposition of stabilization capacitors and dimension and arrangement (interconnect length and interconnect width) of interconnects can be relaxed.

As described above, the memory device of the present embodiment can reduce increase of electric power consumption.

As a result, the memory device of the present embodiment has improved characteristics.

(2) Second Embodiment

A memory device of a second embodiment and a control method thereof will be described below with reference to FIGS. 13 and 14.

FIG. 13 is a pattern diagram for description of a configuration example of the memory device (for example, a magnetoresistive random access memory) of the present embodiment.

As illustrated in FIG. 13, an equalization circuit (word line equalizer) 610 may be provided only for rows (global word lines and word lines) of memory blocks MB. In this case, no equalization circuit is provided for bit lines.

Figure 14:
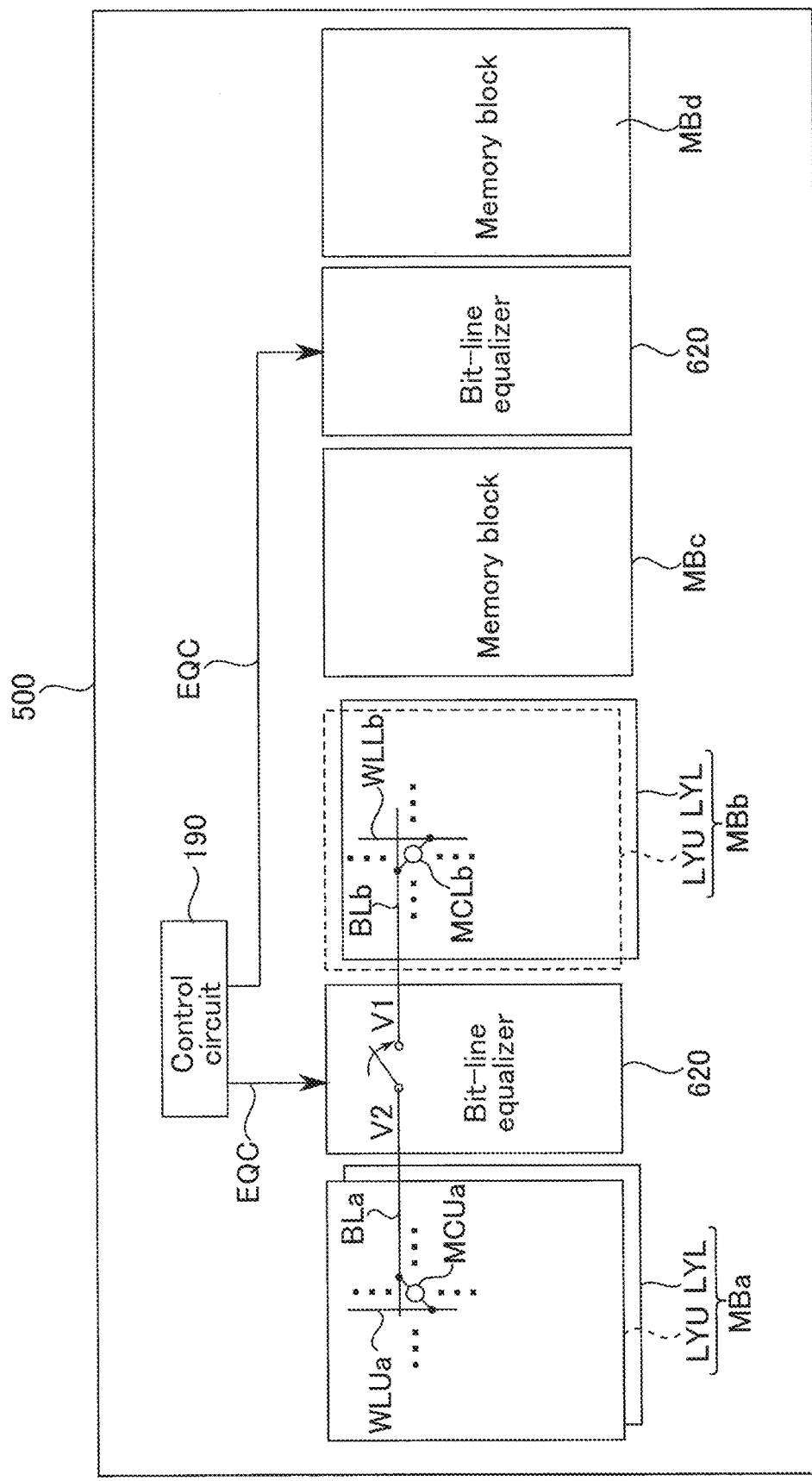
FIG. 14 is a diagram for description of the memory device of the second embodiment.

FIG. 14 is a pattern diagram illustrating another configuration example of the memory device of the present embodiment.

As illustrated in FIG. 14, an equalization circuit (bit line equalizer) 620 may be provided only for columns (global bit lines and bit lines) of memory blocks. In this case, no equalization circuit is provided for word lines.

In the memory device of the present embodiment, precharge can be performed by the equalization circuits through one of charge shear of word lines and charge shear of bit lines.

Accordingly, the memory device of the present embodiment can obtain effects substantially same as those of the memory device of the first embodiment.

(3) Third Embodiment

A memory device of a third embodiment will be described below with reference to FIG. 15.

FIG. 15 is a pattern diagram for description of a configuration example of the memory device (for example, a magnetoresistive random access memory) of the present embodiment.

As illustrated in FIG. 15, a word line equalizer 610 may be commonly connected to two or more memory blocks (for example, four memory blocks) MB. A bit line equalizer 620 may be commonly connected to two or more memory blocks (for example, four memory blocks) MB.

When the number of memory blocks MB connected to an equalization circuit is two or more as in the present embodiment, it is possible to obtain effects substantially same as those of the memory devices of the above-described embodiments.

(4) Fourth Embodiment

A memory device of a fourth embodiment will be described below with reference to FIG. 16.

Figure 16:
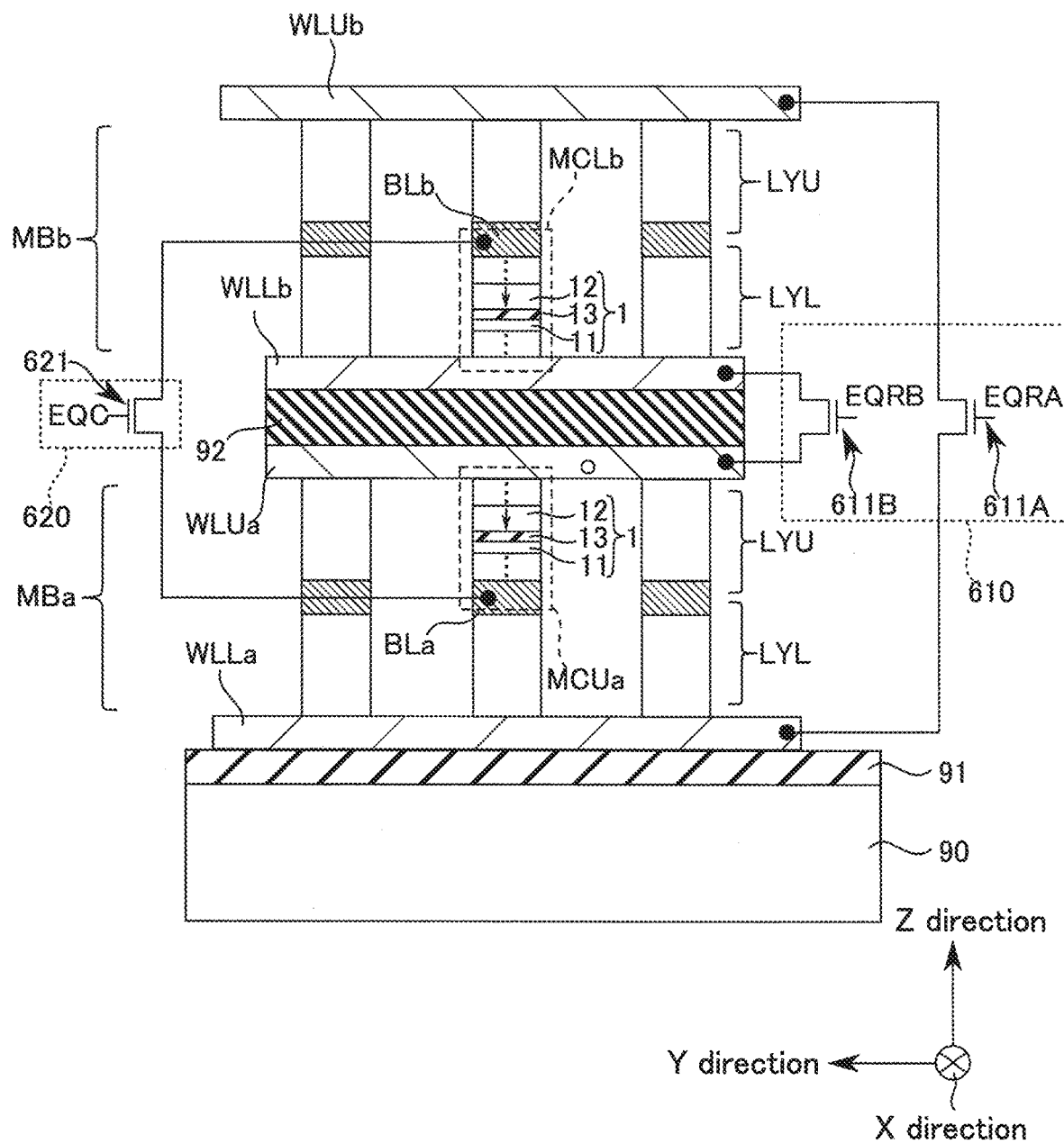
FIG. 16 is a diagram for description of a memory device of a fourth embodiment.

FIG. 16 is a pattern diagram for description of a configuration example of the memory device (for example, a magnetoresistive random access memory) of the present embodiment.

As illustrated in FIG. 16, equalization circuits 610 and 620 may be connected to two memory blocks arranged in a direction (Z direction) perpendicular to a surface of a substrate.

A memory block MBb is provided above a memory block MBa in the Z direction through an insulating layer 92. The memory blocks MBa and MBb each include two array layers LYL and LYU For example, a word line WLUb of the fourth layer from the substrate side (an upper word line of the memory block MBb) and a word line WLLa of the first layer from the substrate side (a lower word line of the memory block MBa) are commonly connected to a transistor 611A of the word line equalizer 610.

The transistor 611A is provided between and connected to the word line WLUb and the word line WLLa. The transistor 611A is controlled to be turned on and off by an equalization signal EQRA.

A word line WLLb of the third layer from the substrate side (a lower word line of the memory block MBb) and a word line of the second layer from the substrate side (an upper word line of the memory block MBa) are commonly connected to a transistor 611B of the word line equalizer 610.

The transistor 611B is provided between and connected to the word line WLUa and the word line WLLb. The transistor 611B is controlled to be turned on and off by an equalization signal EQRB.

A bit line BLa of the memory block MBa and a bit line BLb of the memory block MBb are connected to a transistor 621 of the bit line equalizer 620.

The transistor 621 is provided between and connected to the bit line BLa and the bit line BLb. The transistor 621 is controlled to be turned on and off by an equalization signal EQC.

Similarly to the above-described embodiments, in the memory device of the present embodiment, charge shear after execution of operation can reduce energy to charge bit lines and word lines for the next operation.

As described above, the memory device of the present embodiment can obtain effects substantially same as those of the first to third embodiments.

(5) Modification

A modification of the memory device of each embodiment will be described below with reference to FIG. 17.

Figure 17:
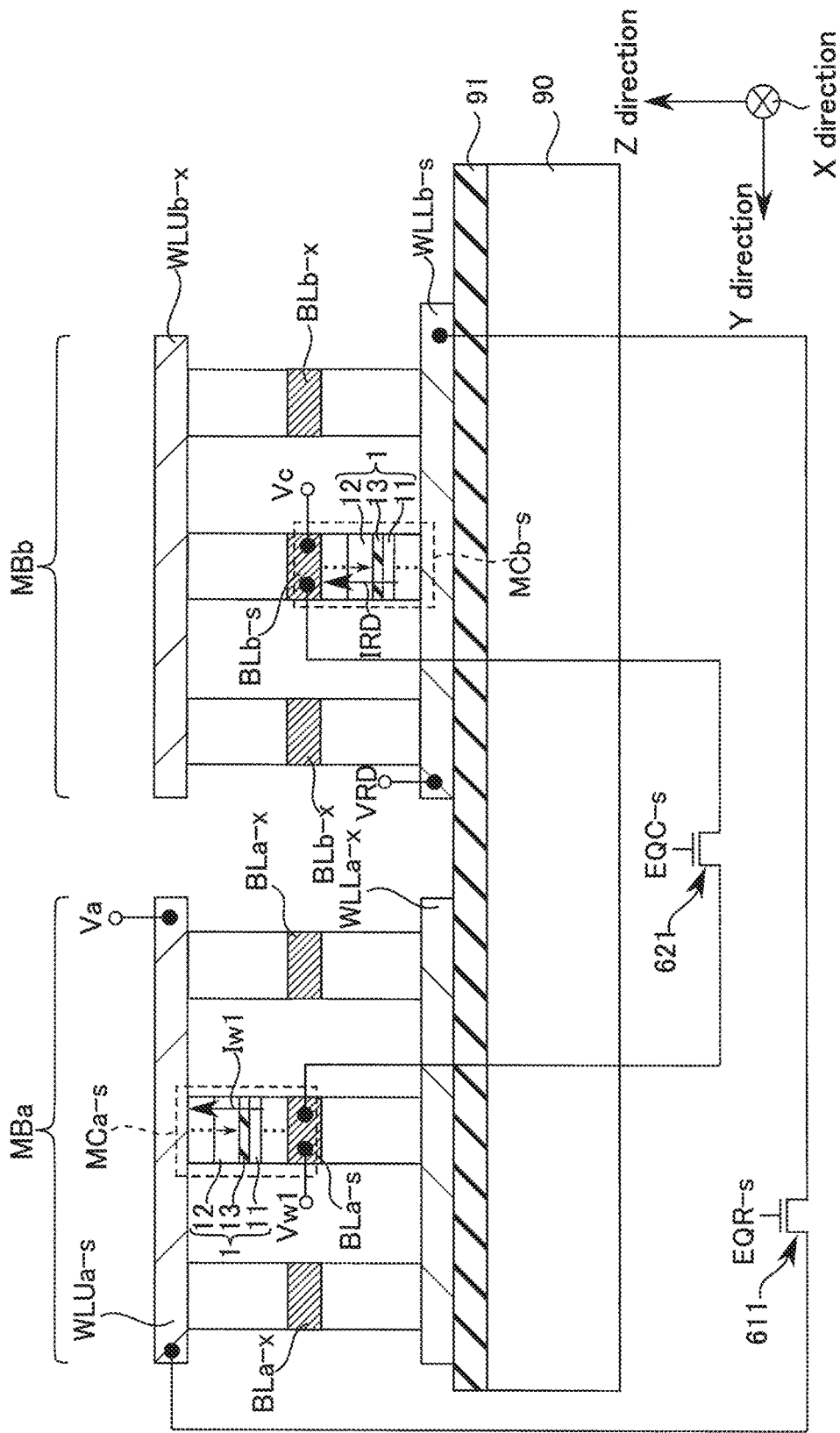
FIG. 17 is a diagram for description of a modification of the memory device of each embodiment.

FIG. 17 is a pattern diagram for description of a memory device of the modification of the present embodiment.

The above description is made with an example in which a plurality of memory blocks connected to an identical equalization circuit execute identical operation.

When at least one of the voltage relation between selected bit lines and the voltage relation between selected word lines is opposite between the memory blocks, executed operation may be different between the memory blocks connected to the identical equalization circuit.

As illustrated in FIG. 17, for example, the write operation of the P write may be executed on one memory block MBa, and the read operation may be executed on the other memory block MBb.

In the memory block MBa, voltage Vw1 is applied to a selected bit line BLa-s, and voltage Va is applied to a selected upper word line WLUa-s. In the memory block MBb, voltage Vc is applied to a selected bit line BLb-s, and voltage VRD is applied to a selected lower word line WLLb-s.

After the read operation and the write operation are both ended, transistors 611 and 621 are set to the on state.

Accordingly, charge shear occurs between the selected bit lines BLa-s and BLb-s and between the selected word lines WLUa-s and WLLb-s.

In an example illustrated in FIG. 17, the potentials of the bit lines BLa-s and BLb-s after the charge shear are set to be a potential between the voltage Vw1 and the voltage Vc (Vc<Vw1).

In the example illustrated in FIG. 17, the potentials of the word lines WLUa-s and WLLb-s after the charge shear are set to be a potential between the voltage VRD and the voltage Va (Va<VRD).

In this manner, in the present modification, the interconnects are charged through the charge shear.

The memory device of the present modification can obtain effects similarly to those of the above-described embodiments.

(6) Other Respects

In the memory device of the present embodiment, a magnetoresistive effect element of an in-plane magnetization type may be used as the memory element. In the magnetoresistive effect element (for example, an MTJ element) of the in-plane magnetization type, each magnetic layer has in-plane magnetic anisotropy. The direction of a magnetization easy axis of each magnetic layer is parallel to a layer surface of the magnetic layer. Each magnetic layer has magnetization parallel to the layer surface. The direction of magnetization of each magnetic layer is perpendicular to an array direction of the magnetic layer.

The memory device of the present embodiment may be a magnetoresistive random access memory of a magnetic field write scheme, a phase change memory, a phase change RAM (PCRAM), a resistance change memory, a resistive RAM (ReRAM), or a conductive-bridging RAM (CBRAM).

In the present embodiment, a configuration described as "connection" not only includes a configuration in which two components are directly connected to each other without any other element interposed therebetween, but also includes a configuration in which the two components are indirectly connected to each other through any other element, as appropriate in accordance with the relation between the components.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a first memory cell provided between a first interconnect and a second interconnect;
a second memory cell provided between the second interconnect and a third interconnect;
a third memory cell provided between a fourth interconnect and a fifth interconnect;
a fourth memory cell provided between the fifth interconnect and a sixth interconnect;
a first equalization circuit connected to the first, third, fourth, and sixth interconnects; and
a control circuit configured to perform a control operation on the first to fourth memory cells,
wherein:
during execution of the control operation, the control circuit:
selects the first and fourth memory cells,
applies a first voltage to the first interconnect,
applies a second voltage higher than the first voltage to the second interconnect,
applies a third voltage lower than the second voltage to the fifth interconnect, and
applies a fourth voltage higher than the third voltage to the sixth interconnect, and
after execution of the control operation, the first equalization circuit electrically connects the first interconnect to the sixth interconnect.

2. The memory device of claim 1, wherein a potential of the first and sixth interconnects electrically connected to each other have a fifth voltage between the first voltage and fourth voltage.

3. The memory device of claim 1, further comprising a second equalization circuit connected to the second interconnect and fifth interconnect, wherein, after the execution of the control operation, the second equalization circuit electrically connects the second interconnect to the fifth interconnect.

4. The memory device of claim 3, wherein a potential of the second and fifth interconnects electrically connected to each other set a sixth voltage between the second and third voltage.

5. The memory device of claim 1, wherein, during execution of the control operation, a first current flows inside the first memory cell from the second interconnect toward the first interconnect, and a second current flows inside the fourth memory cell from the sixth interconnect toward the fifth interconnect.

6. The memory device of claim 1, wherein:
the first and fourth interconnects are provided above a substrate,
the third interconnect is provided between the first interconnect and the substrate,
the second interconnect is provided between the first interconnect and third interconnect,
the sixth interconnect is provided between the fourth interconnect and the substrate, and
the fifth interconnect is provided between the fourth interconnect and sixth interconnect.

7. The memory device of claim 1, wherein the first equalization circuit includes:
a first transistor provided between and connected to the first interconnect and sixth interconnect, and
a second transistor provided between and connected to the third interconnect and fourth interconnect.

8. The memory device of claim 1, wherein:
the first, the second, the third and the fourth memory cells include first, second, third and fourth magnetoresistive effect elements, respectively, and
the first to fourth magnetoresistive effect elements each include a reference layer and a storage layer arranged in a first order.

9. The memory device of claim 8, wherein:
the first, the second, the third and the fourth memory cells include first, second, third and fourth switching elements, respectively,
the first switching element is provided between the first magnetoresistive effect element and the second interconnect, the second switching element is provided between the second magnetoresistive effect element and the third interconnect, the third switching element is provided between the third magnetoresistive effect element and the fifth interconnect, and the fourth switching element is provided between the fourth magnetoresistive effect element and the sixth interconnect.

10. The memory device of claim 8, wherein:

the first magnetoresistive effect element includes a first storage layer between the first interconnect and the second interconnect, a first reference layer between the first interconnect and the first storage layer, and a first tunnel barrier layer between the first storage layer and the first reference layer, the second magnetoresistive effect element includes a second storage layer between the second interconnect and the third interconnect, a second reference layer between the second interconnect and the second storage layer, and a second tunnel barrier layer between the second storage layer and the second reference layer, the third magnetoresistive effect element includes a third storage layer between the fourth interconnect and the fifth interconnect, a third reference layer between the fourth interconnect and the third storage layer, and a third tunnel barrier layer between the third storage layer and the third reference layer, and the fourth magnetoresistive effect element includes a fourth storage layer between the fifth interconnect and the sixth interconnect, a fourth reference layer between the fifth interconnect and the fourth storage layer, and a fourth tunnel barrier layer between the fourth storage layer and the fourth reference layer.

11. The memory device of claim 8, wherein:

a value of the first voltage is equal to a value of the third voltage, and a value of the second voltage is equal to a value of the fourth voltage.

12. The memory device of claim 8, wherein:

a value of the first voltage is different from a value of the third voltage, and a value of the second voltage is different from a value of the fourth voltage.

13. A memory device comprising:

a first memory cell provided between a first interconnect and a second interconnect;

a second memory cell provided between the second interconnect and a third interconnect;

a third memory cell provided between a fourth interconnect and a fifth interconnect;

a fourth memory cell provided between the fifth interconnect and a sixth interconnect;

a first equalization circuit connected to the first, third, fourth, and sixth interconnects; and a control circuit configured to perform a control operation on the first to fourth memory cells, wherein:

during execution of the control operation, the control circuit:

selects the first and fourth memory cells, applies a first voltage to the first interconnect, applies a second voltage higher than the first voltage to the second interconnect, applies a third voltage lower than the second voltage to the fifth interconnect, and applies a fourth voltage higher than the third voltage to the sixth interconnect, and after execution of the control operation, the first equalization circuit electrically connects the second interconnect to the fifth interconnect.

14. The memory device of claim 13, wherein a potential of the second and fifth interconnects electrically connected to each other have a fifth voltage between the second voltage and third voltage.

15. The memory device of claim 13, wherein, during execution of the control operation, a first current flows in the first memory cell from the second interconnect toward the first interconnect, and a second current flows in the fourth memory cell from the sixth interconnect toward the fifth interconnect.

16. The memory device of claim 13, wherein:

the first and fourth interconnects are provided above a substrate, the third interconnect is provided between the first interconnect and the substrate, the second interconnect is provided between the first interconnect and third interconnect, the sixth interconnect is provided between the fourth interconnect and the substrate, and the fifth interconnect is provided between the fourth interconnect and sixth interconnect.

17. The memory device of claim 13, wherein the first equalization circuit includes:

a first transistor provided between and connected to the first interconnect and sixth interconnect, and a second transistor provided between and connected to the third interconnect and fourth interconnect.

18. The memory device of claim 13, wherein:

the first, the second, the third and the fourth memory cells include first, second, third and fourth magnetoresistive effect elements, respectively, and the first to fourth magnetoresistive effect elements each include a reference layer and a storage layer arranged in a first order.

19. The memory device of claim 18, wherein:

the first, second, third and fourth memory cells include first, second, third and fourth switching elements, respectively, the first switching element is provided between the first magnetoresistive effect element and the second interconnect, the second switching element is provided between the second magnetoresistive effect element and the third interconnect, the third switching element is provided between the third magnetoresistive effect element and the fifth interconnect, and the fourth switching element is provided between the fourth magnetoresistive effect element and the sixth interconnect.

20. The memory device of claim 13, wherein:

a value of the first voltage is equal to a value of the third voltage, and a value of the second voltage is equal to a value of the fourth voltage.

* * * * *